United States Patent [19]
Schein

[11] Patent Number: 5,513,099
[45] Date of Patent: Apr. 30, 1996

[54] CIRCUIT BOARD REPAIR AND REWORK APPARATUS

[75] Inventor: Charles Schein, Skokie, Ill.

[73] Assignee: Probot Incorporated, Branford, Conn.

[21] Appl. No.: 15,219

[22] Filed: Feb. 8, 1993

[51] Int. Cl.[6] .................................................. G06K 9/00
[52] U.S. Cl. ........................ 364/167.01; 382/149
[58] Field of Search ................. 364/167.01, 468, 364/560, 488–491; 382/258, 149; 228/102, 105, 103, 7–9, 12; 348/189, 190

[56] References Cited

U.S. PATENT DOCUMENTS

| | | | |
|---|---|---|---|
| 4,307,940 | 12/1981 | Hagedorn-Olsen | 350/254 |
| 4,469,553 | 9/1984 | Whitehead | 156/627 |
| 4,811,410 | 3/1989 | Amir et al. | 382/8 |
| 4,832,250 | 5/1989 | Spigarelli et al. | 228/102 |
| 4,884,145 | 11/1989 | Kaye et al. | 358/229 |
| 4,928,313 | 5/1990 | Leonard et al. | 382/8 |
| 5,027,417 | 6/1991 | Kitakado et al. | 382/149 X |
| 5,040,059 | 8/1991 | Leberl | 364/560 X |
| 5,132,534 | 7/1992 | Namigawara | 250/239 |
| 5,163,128 | 11/1992 | Straayer | 395/129 |
| 5,172,420 | 12/1992 | Ray et al. | 382/55 X |
| 5,204,912 | 4/1993 | Schimanski | 382/149 |

Primary Examiner—Roy N. Envall, Jr.
Assistant Examiner—Brian C. Oakes
Attorney, Agent, or Firm—Gregory S. Rosenblatt

[57] ABSTRACT

The circuit board repair and rework apparatus comprises: a camera; a device for positioning a circuit board in a predetermined location beneath the camera; a computer including a CPU and memory; electrical circuitry coupled between the camera and the computer for digitizing the camera image and supplying the digitized representation of the camera image to the computer; a visual display coupled to the computer; the memory storing "GERBER" data related to a plot or layout of the circuit board positioned beneath the camera; electro mechanical structure coupled to the computer for positioning the camera at a desired position over the circuit board; electro mechanical structure for focusing the camera on the circuit board; and, input devices and circuitry to the computer for controlling the position of the camera and for causing an overlay on the visual display between a plot of the digitized camera image of the circuit board and the plot of the circuit board obtained from the "GERBER" data.

5 Claims, 24 Drawing Sheets

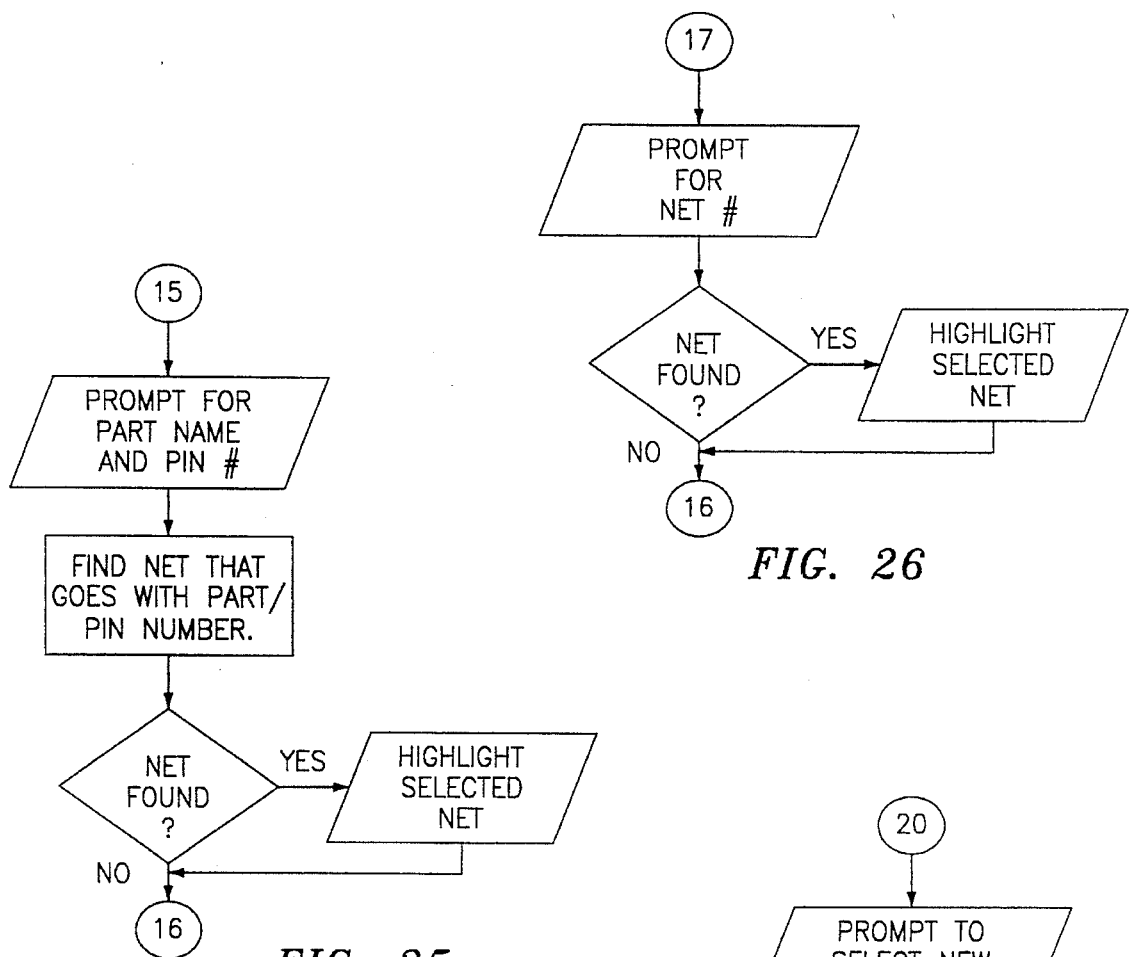
*FIG. 26*
*FIG. 25*
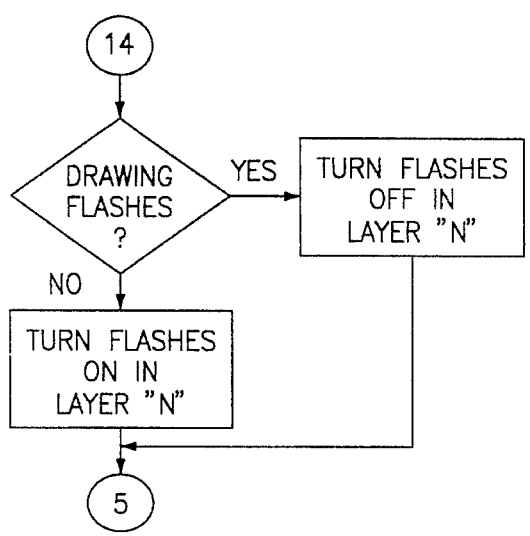
*FIG. 28*
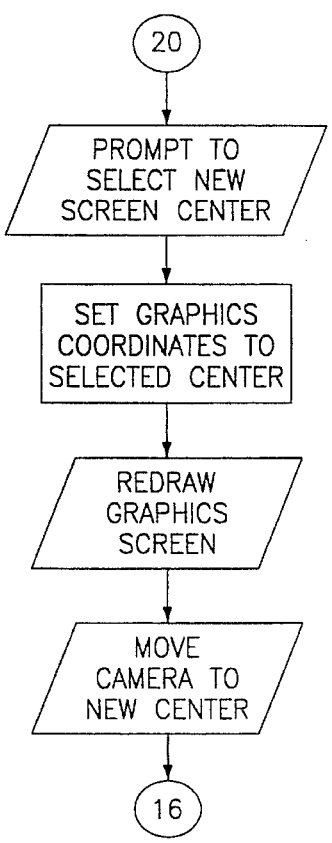
*FIG. 30*

CIRCUIT BOARD REPAIR AND REWORK APPARATUS

BACKGROUND OF THE INVENTION

1. Field of the Invention

The present invention is directed to a circuit board repair and rework apparatus at a circuit board repair and rework station. At the work station, a circuit board is positioned on a work table of the apparatus. Then, with a camera, an image of an actual circuit board to be worked on is captured by the camera and the camera output is digitized. Then, the digitized data is converted by a computer and displayed on the screen of a computer monitor. Subsequently, pertinent circuit board data, or so-called "GERBER" data, is superimposed or overlaid on the circuit board image on the screen of the computer monitor which had been obtained from the digitized camera signal. Then, from the "GERBER" data and with a mouse cursor, the electrical circuit location of the cursor on the circuit board image can be determined or, from the "GERBER" data, the circuit component at the cursor position on the circuit board position readily can be determined to enable an operator quickly to analyze, repair or rework the circuitry on the circuit board on the table.

2. Description of the Related Art Including Information Disclosed Under 37 CFR § 1.97–1.99

Heretofore, it has been proposed in the Whitehead U.S. Pat. No. 4,469,553, to project circuit board data ("GERBER" data) from a plasma screen of a computer onto a half mirror. Then beneath the mirror is positioned a circuit board which can be viewed through the mirror while at the same time the "GERBER" data is projected on the mirror in registry with the circuit board so that an operator can view the circuit board through the mirror for correlating the "GERBER" data projected onto the mirror with the actual circuit board positioned below the mirror.

SUMMARY OF THE INVENTION

According to the present invention there is provided a circuit board repair and rework apparatus comprising: a camera; a device for positioning a circuit board in a predetermined location beneath the camera; a computer including a CPU and memory; electrical circuitry coupled between the camera and the computer for digitizing the camera image and supplying the digitized representation of the camera image to the computer; a visual display coupled to the computer; the memory storing "GERBER" data related to a plot or layout of the circuit board positioned beneath the camera; electro mechanical structure coupled to the computer for positioning the camera at a desired position over the circuit board; electro mechanical structure for focusing the camera on the circuit board; and, input devices and circuitry to the computer for controlling the position of the camera and for causing an overlay on the visual display between a plot of the digitized camera image of the circuit board and the plot of the circuit board obtained from the "GERBER" data.

Further according to the present invention there is provided a method for repairing or reworking a circuit board utilizing a camera and a computer including a CPU and memory having "GERBER" data related to a plot or layout of a circuit board under investigation stored therein, the method comprising the steps of: positioning a circuit board in a predetermined location beneath the camera; digitizing the camera image and supplying the digitized representation of the camera image to the computer; positioning the camera at a desired position over the circuit board; focusing the camera on the circuit board; and, establishing on a visual display coupled to the computer an overlay in registry between a plot of the digitized camera image of the circuit board and the plot of the circuit board generated from the "GERBER" data.

BRIEF DESCRIPTION OF THE DRAWINGS

FIGS. 18–29 are protocols of the various routines carried out by the program/software in the computer of the apparatus of the present invention and will be briefly summarized below.

FIG. 18 is a block flow diagram of the steps carried out by the apparatus in initializing the apparatus and proceeding to repair or rework a specific circuit board.

FIG. 19 is a block flow diagram of the steps carried out by an operator of the apparatus in utilizing the apparatus to repair or rework the circuit board proceeding from the MAIN MENU.

FIG. 20 is a block flow diagram of the steps performed proceeding from the SETUP MENU for calibrating the apparatus and aligning the camera.

FIGS. 21A, 21B, 21C, 21D, 21E, 21F, 21G, FIG. 22 and FIG. 23 are block flow diagrams of subroutines carried out from the decision steps set forth in FIG. 19 and FIG. 20.

FIG. 24 is a block flow diagram of subroutine carried out from the BUZZ OUT MENU and which loops back to connection point 16, as shown.

FIGS. 25 and 26 are subroutines carried out from the DRAW BUZZ OUT MENU shown in FIG. 24.

FIG. 27 is a block flow diagram of the steps or protocol carried out from the DRAW LAYER MENU shown in FIG. 19.

FIG. 28 is the steps or protocol of a subroutine when a question/decision toggle draw flashes is determined in the program or protocol shown in FIG. 27.

FIG. 29 is a block flow diagram of the steps carried out by the DRAW VIEW MENU after the program has proceeded to the steps of the DRAW CALIBRATION MENU shown in FIG. 22 for redrawing the graphic screen.

FIG. 30 is a block flow diagram of the steps of a subroutine for recentering the center of the screen of the visual display on the monitor relative to the center of the photo plot of "GERBER" Data.

DESCRIPTION OF THE PREFERRED EMBODIMENT(S)

Figure 1:
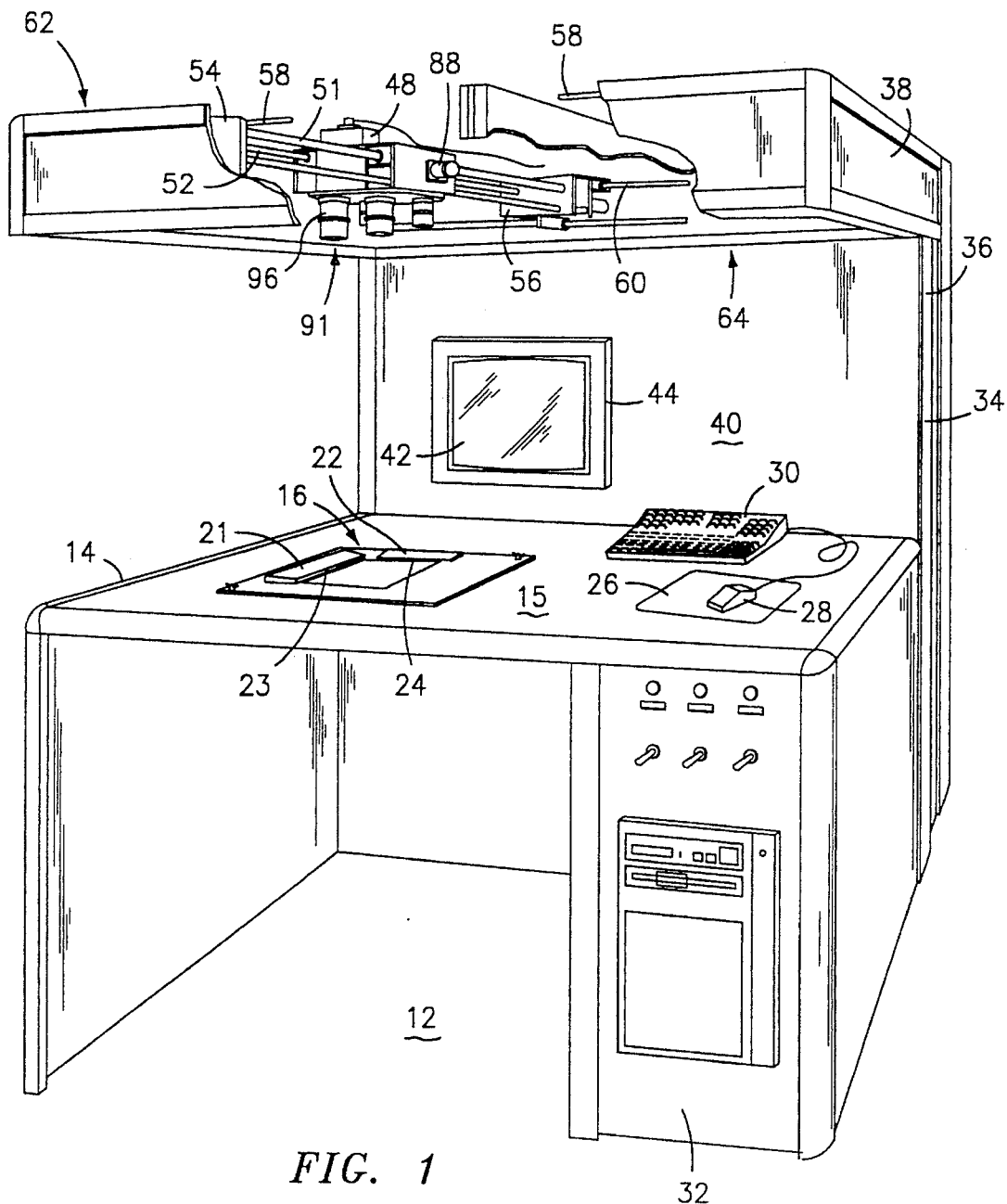
FIG. 1 is a front perspective view, with portions broken away, of the circuit board repair and rework apparatus of the present invention at a circuit board repair and rework station.

Referring now to the drawings in greater detail, there is illustrated in FIG. 1 a circuit board repair and rework apparatus 10 constructed according to the teachings of the present invention located at a circuit board repair and rework station 12. The apparatus 10 includes a desk or work table 14 having mounted, on a top 15 thereof, a fixture 16 for holding a circuit board 18. The fixture 14 includes first and second elongate plates 21 and 22 each of which has a locating edge 23 or 24 positioned at a right angle, 90°, to the other locating edge 24 or 23.

Located on the desk top 15 is a mouse pad 26, a mouse 28 and a computer keyboard 30. On one side of the desk 14 and located between the desk top 15 and the floor is a computer 32.

Behind the desk 14 is a cabinet 34 which extends from the floor upwardly to a height of about six (6) feet above the floor. Then, extending from a top 36 of the cabinet 34, in a cantilever manner, is a generally rectangular housing 38.

Mounted on a front wall 40 of the cabinet 34 is a video display or screen 42 of a computer monitor 44.

Mounted within the housing 38, and hidden from view, is a motion control circuit 46 (FIG. 5) which can be realized by a programmable preset indexer, Model CL1734, sold by Anaheim Automation in Anaheim, Calif. The computer monitor 44 is a VGA monitor.

Mounted in the housing 38 is a video camera 48 which can be an NTSC or PAL video camera 48.

Figure 2:
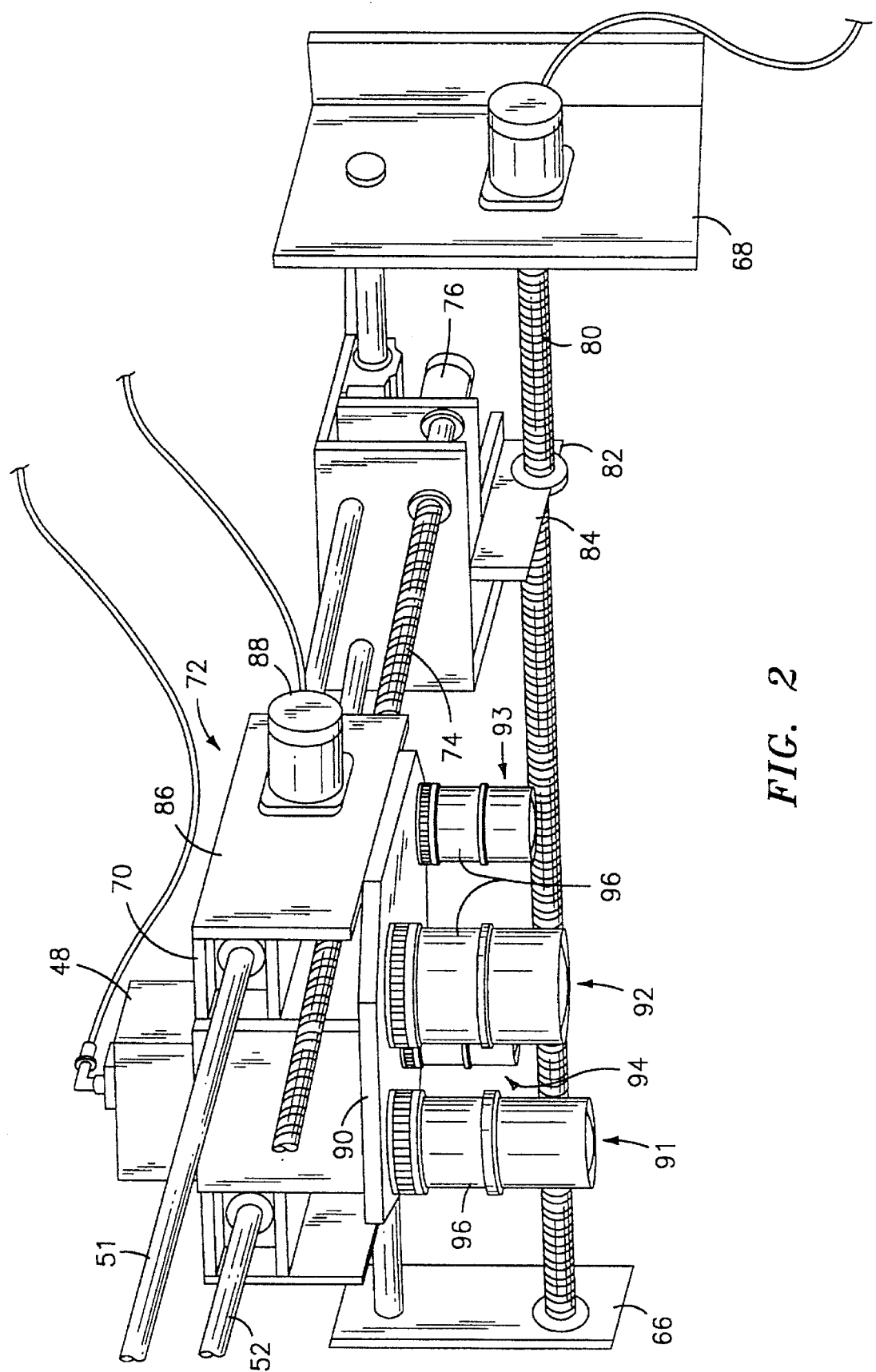
FIG. 2 is a perspective view of the X axis and Y axis drive mechanisms and rotating mechanism for the lenses and camera shown in FIG. 1 but with portions broken away.

As shown in FIGS. 1 and 2, the video camera 48 is slideably mounted on parallel spaced slide rods 51 and 52 which extend in a direction, which is referred to herein as the Y axis. The two slide rods 50 and 52 extend between first and second carriages 54 and 56 each mounted on a rod 58 or 60 that extends in a direction parallel to a horizontal X axis. The carriage 54 is mounted at a front end 62 of the housing 38 and the other carriage 56 is mounted at a rear end 64 of the housing 38 between spaced apart mounting plates 66 and 68 (FIG. 2).

Extending between the carriages 54 and 56 and through a framework 70 of a third carriage 72 mounting the camera 48 is a threaded shaft 74 which is rotatably driven by a forward/reverse stepper motor 76 mounted on the carriage 56. The threaded shaft 76 functions as a worm gear 76 for moving the carriage 72 and the camera 48 mounted thereon in a direction parallel to the Y axis and extends through a threaded throughbore in a block (not shown) forming part of the framework 70. In a similar manner, a forward/reverse stepper motor 78 is mounted to the mounting plate 68 and drives a threaded shaft or worm gear 80 that extends through a threaded throughbore 82 in a block 84 depending from the carriage 56 as best shown in FIG. 2.

It will be understood that movement of the camera carriage in either the X or Y direction is controlled by the stepper motors 76 and 78, which in turn are controlled by the computer 32.

Mounted on a side plate 86 of the framework 70 of the carriage 72 is another forward/reverse stepper motor 88 which has a threaded shaft or worm gear (hidden from view in FIG. 2), extending therefrom within the framework 70 of the camera carriage 72. This threaded shaft (not shown) engages a pinion gear (not shown) that is mounted on a journaled shaft (not shown) that extends vertically along the Z axis and has a lower end fixed to a lens mounting plate or table 90. Extending downwardly from the lens mounting plate 90 are four lenses 91, 92, 93, and 94 having different magnifications.

Figure 3:
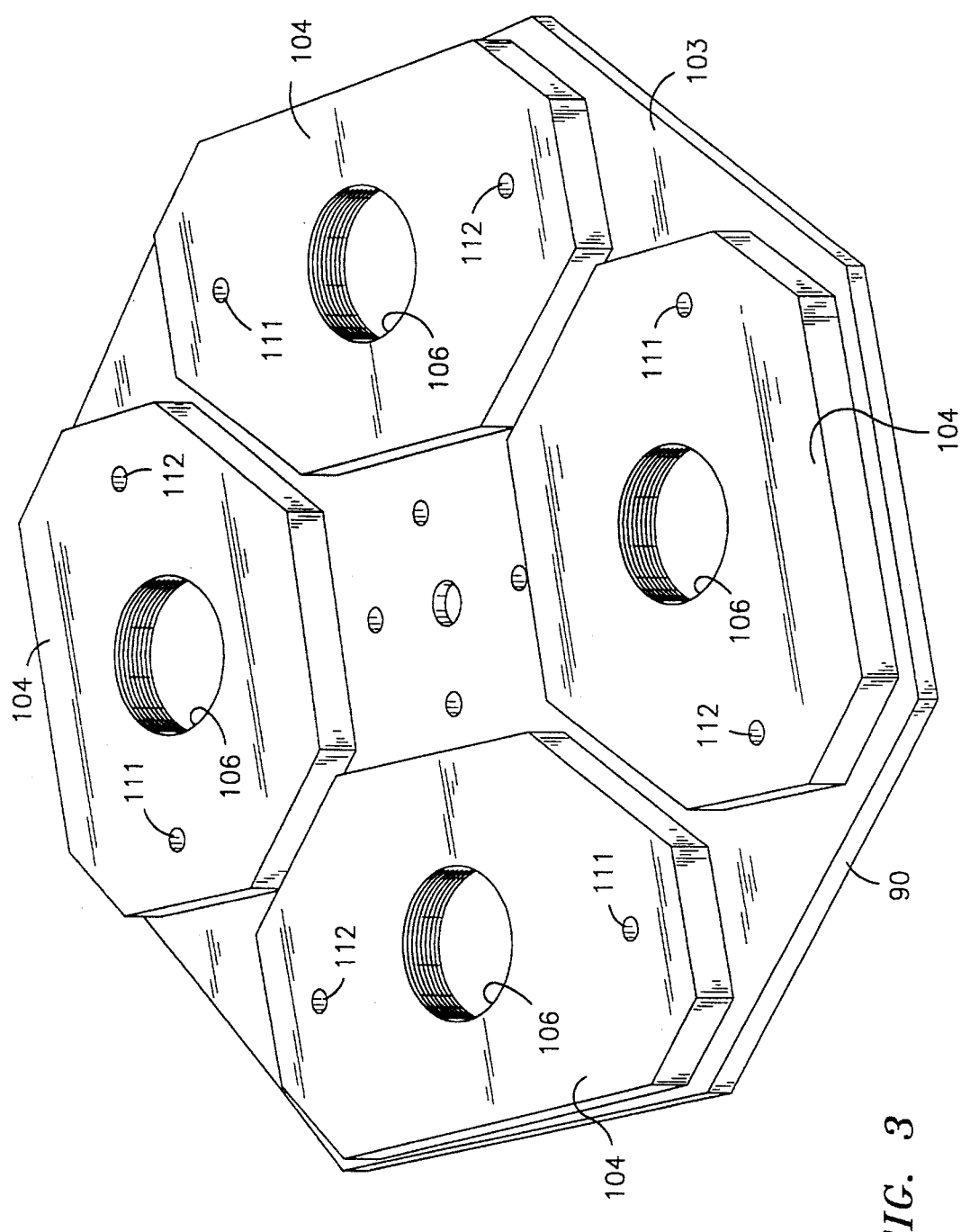
FIG. 3 is a perspective view of adjustable lens mounting blocks positioned adjacent a lens mounting plate of the lens assembly of the present assembly.
Figure 4:
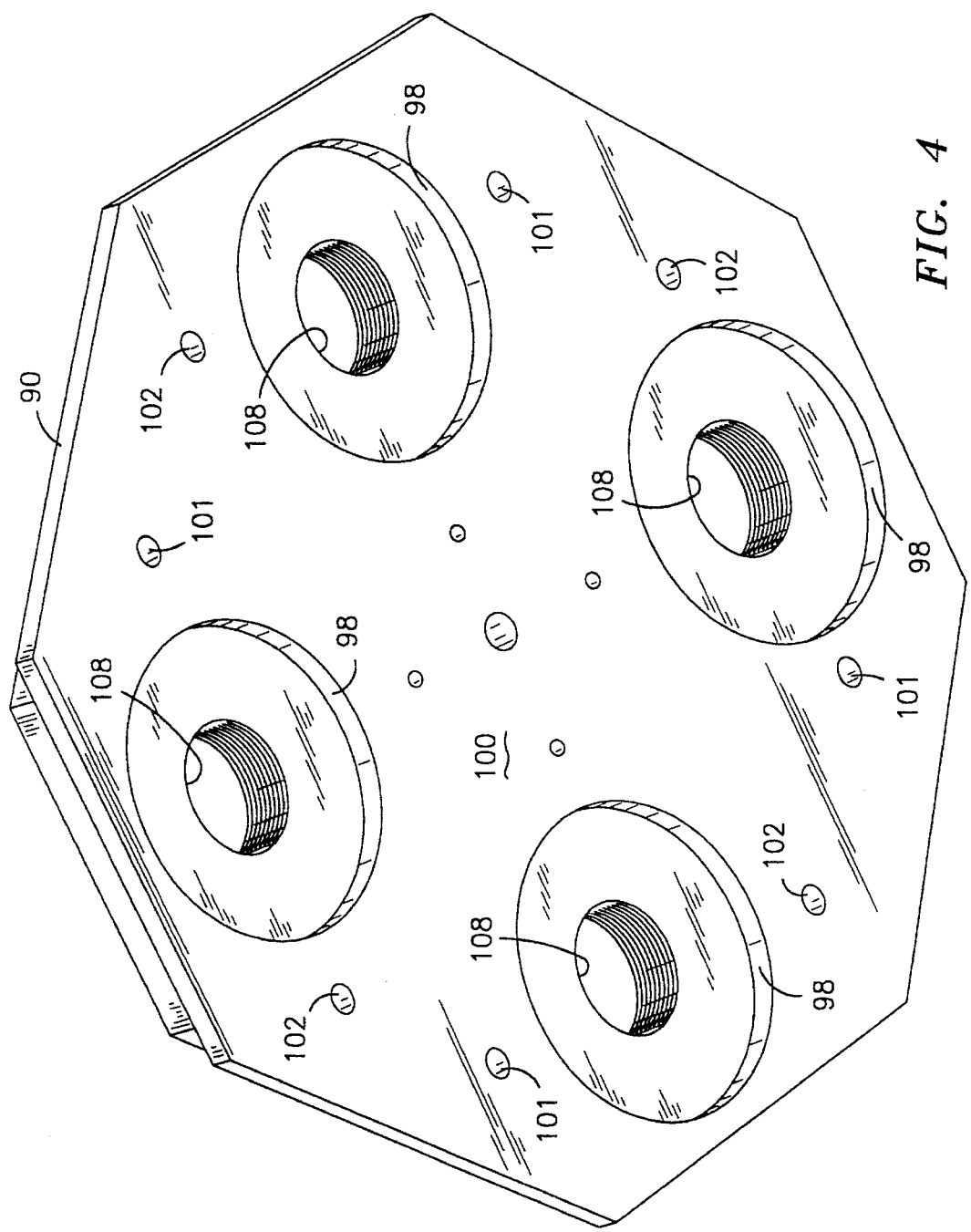
FIG. 4 is a perspective view of the lens mounting plate, as shown in FIG. 3, without the lens mounting blocks.

Referring now to FIGS. 2, 3 and 4, each of the lenses 91–94 include a cylindrical housing 96 which is received in one of four cylindrical cutouts 98 on, and spaced around the center of, a bottom side 100 of the lens mounting plate 90 as shown in FIG. 4. As shown in FIG. 4, there is located on either side of each cutout 98 first and second holes 101 and 102. Now, positioned on a top side 104 of the lens mounting plate 90 are four identical lens mounting blocks 104 each with a throughbore 106 aligned with one of four throughbores 108 that extend through the lens mounting plate 90, each being coaxial with one of the cylindrical cutouts 98. Each block 104 has first and second threaded holes 111 and 112 therethrough on either side of the throughbore 106 in alignment with the first and second holes 101 and 102 on either side of one of the cylindrical cutouts 98 in the lens mounting plate 90.

According to the teachings of the present invention, the first and second holes 101 and 102 in the lens mounting plate 90 are of larger diameter than the first and second threaded holes 111 and 112 in each of the mounting blocks 104.

Although not shown in FIGS. 1 and 2, it will be understood that threaded bolts preferably with a wing head are received through the first and second holes 101 and 102 in the lens mounting plate 90 and are threadedly received in the first and second threaded holes 111 and 112 in one of the mounting blocks 104.

Also, each one of the lens housings 96 has an upper cylindrical extension (not shown) having a diameter less than the diameter of the cylindrical housing 96. Each smaller-in-diameter cylindrical extension is pressed fit or otherwise secured in one the throughbores 106 in each mounting block 104. Each throughbore 108 in the lens mounting plate 90 is of slightly greater diameter than the diameter of the cylindrical extension.

With this mounting arrangement for the lenses 91–94, each lens 91–94 can be shifted slightly along the X axis or the Y axis simply by loosening the wing headed bolts in, or wing nuts on bolts extending downwardly from, the threaded holes 111 and 112 and shifting the lens housing 96, within one of the larger-in-diameter cutouts 98 in the lens mounting plate 90, and the cylindrical extension thereof within one of the larger-in-diameter throughbores 108 in lens mounting plate 90, followed by retighting of the bolts or nuts.

The amount of "play" or the amount of shifting of a lens housing 96 on the bottom side 100 of the lens mounting plate 90 is up to a quarter of an inch along the X or Y axis from the center or axis of one of the throughbores 108 in the lens mounting plate 90. This adjustability enables an operator of the apparatus 10 to compensate for any skew of the Z axis of one of the lens 91, 92, 93 or 94 or of the axis of the camera 48 or of tilt of the circuit board 18 positioned in the fixture 16 away from the vertical Z axis of the camera 48.

Figure 5:
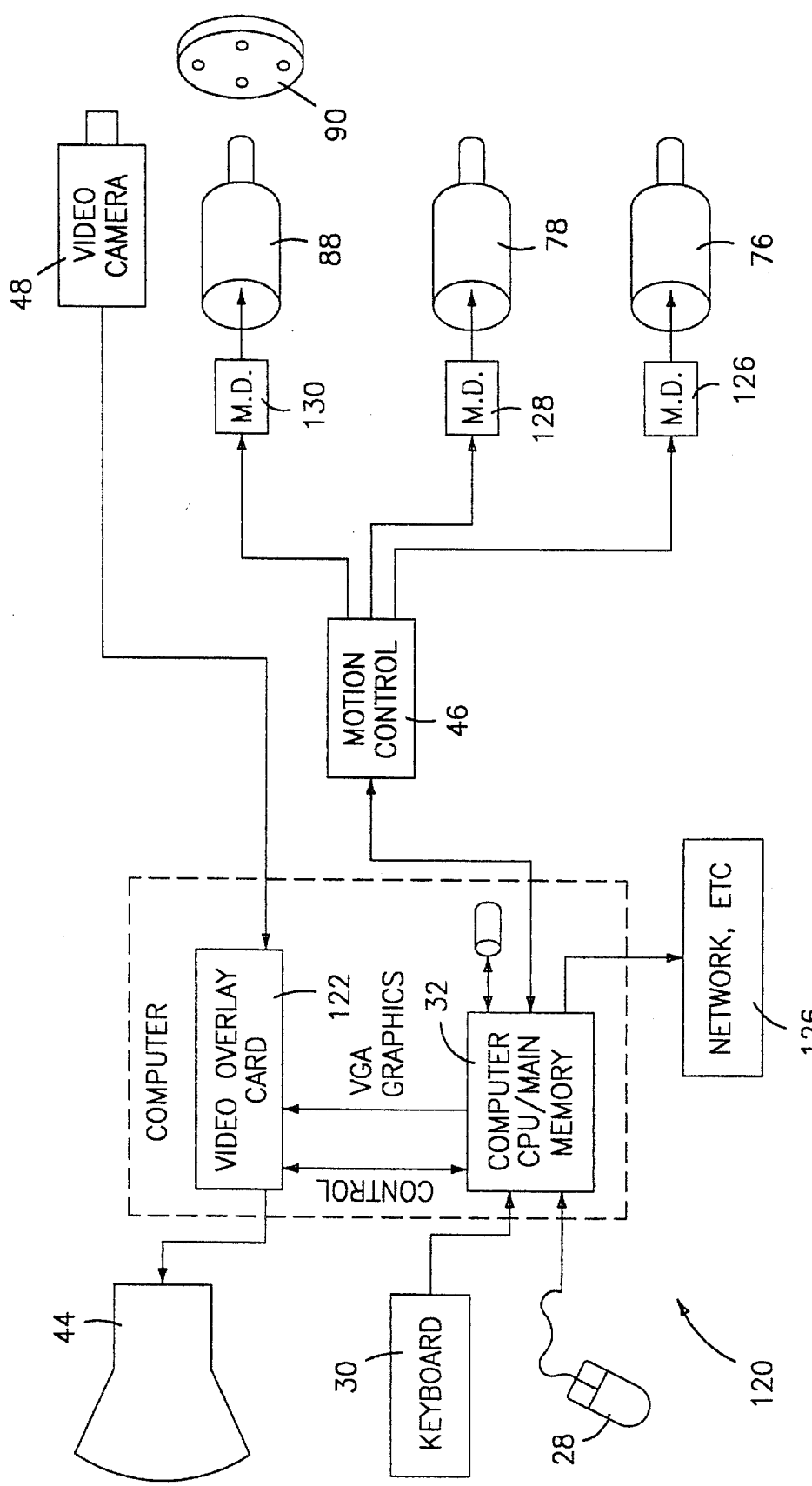
FIG. 5 is a block schematic electrical circuit diagram of the electrical circuitry for the circuit board repair and rework apparatus.

FIG. 5 is a block circuit diagram of the electrical circuitry 120 of the apparatus 10 of the present invention. As shown, the circuitry 120 includes the computer 32 having a CPU/MAIN MEMORY coupled to the keyboard 30, to the mouse 28 and to a video overlay card 122 which can be of the type sold by Microvitec of Great Britain under the tradename "David Board".

A terminal 124 is provided from the computer 32 for connection to a network 126 in the event one wants to feed data into the computer 32 from the network 126.

The video overlay card 122 is also coupled to the video camera 48 and the VGA monitor 44. The CPU is also coupled to the motion control circuit 46 which in turn is coupled to motor driver circuits 126, 128, and 130 which in turn are coupled to stepper motors 76, 78, and 88.

A software program which will be entitled "RAID" and which interprets so called "GERBER" data (developed by Gerber Scientific, Inc. over twenty years ago) is stored in the MAIN MEMORY (ROM or RAM) of the apparatus 10. "GERBER" data is also used by automatic test equipment fixture finishers who manufacture test fixtures. These fixtures have a "bed of nails" which access all necessary locations on a printed circuit board to be tested.

A general explanation of the how a photo plotter is used with "GERBER" data to make the art work for a printed circuit board is set forth below. It is necessary to have a thorough understanding of this process while using the apparatus 10.

A photo plotter works exactly the same as a pen plotter, except instead of using a pen on paper, it uses a light or laser on film. The photo plotter draws lines (traces) and shapes (flashes) on film. The film is then developed and this is what is used to "engrave" the actual circuit board. The dark areas have copper and the clear areas do not.

A pen plotter can be used with different color and/or thickness pens, whereas a photo plotter can use different aperture openings to create different thickness lines. These apertures can also have special shapes such as squares, circles, rectangles, targets, etc. These openings are arranged on an aperture wheel and each shape has a code which starts with a "D". D codes for apertures start with D10 and go to D255. D codes 1 through 9 give the plotter instructions, such as open shutter, close shutter or flash (open and close without moving). The apparatus 10 and the RAID software therein allows up to 1000 logical Apertures even though there is not an actual physical shape on the Aperture wheel.

Each layer of a printed circuit board (PCB) is a separate file. The electrical connections between layers is accomplished by plated through holes (VIAs). On small PCBs all or many of the layers may be printed on different areas of the same film. Also some middle layers and the bottom layers might be mirrored. The apparatus 10 including the RAID software therein has utilities to mirror, rotate and snap each layer to another so they line up as they would when the actual PCB is assembled.

The purpose of the photo plot is to produce dark areas on film, which converts to copper. Areas that are not dark will not have any copper. The "GERBER" data file itself caries no information regarding which traces and flashes are connected on each layer or between layers. The RAID software interprets the D codes and coordinates given to the photo plotter to link all traces and flashes on each layer. As each layer from the top layer down is interpreted, the RAID software links the layers together using a drill or via data. At the end of the process the RAID software creates a data base that not only knows the dark area of the film, but knows the electrical connectivity of the entire board. In other words, the RAID software creates a NET LIST by coordinates and layer.

Figure 6:
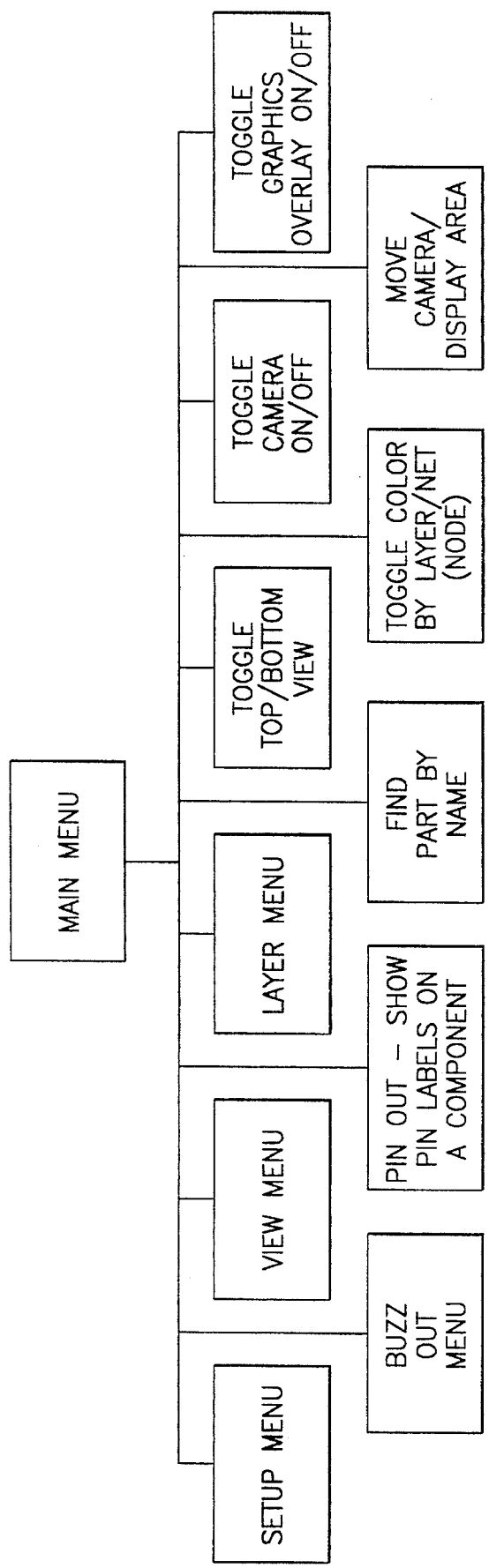
FIG. 6 is a block diagram of the MAIN MENU for the circuit board repair and rework apparatus.
Figure 7:
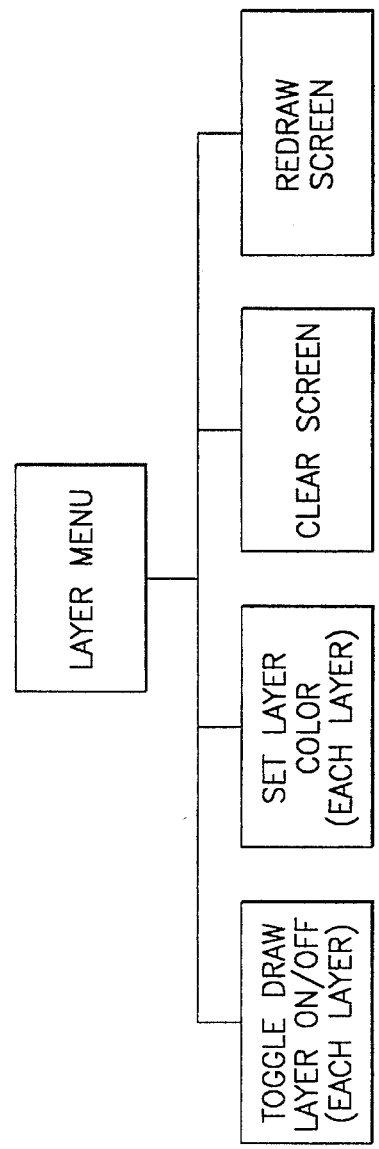
FIG. 7 is a block diagram of the LAYER MENU shown in FIG. 6.
Figure 8:
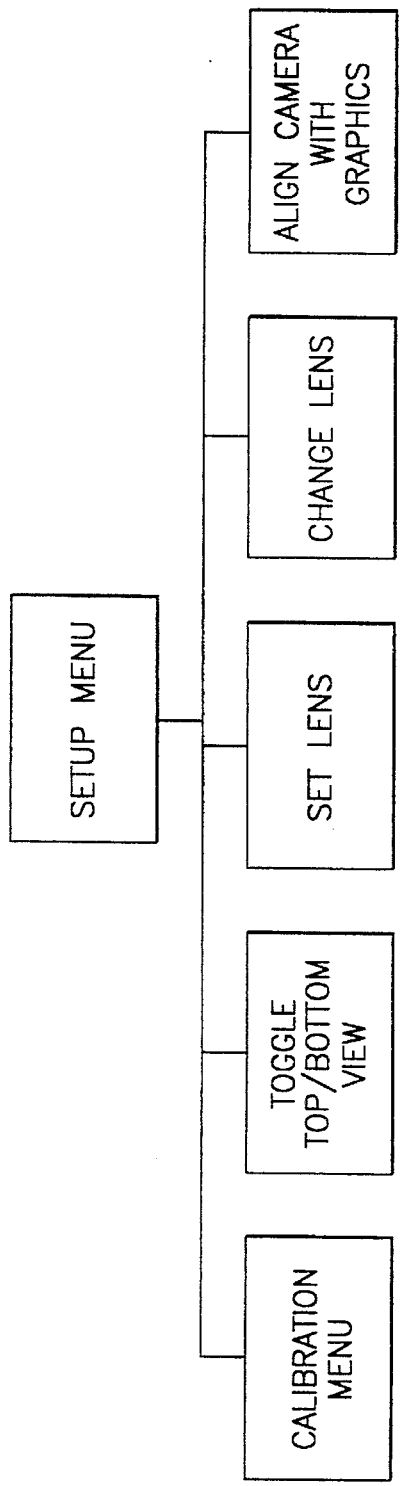
FIG. 8 is a block diagram of the SETUP MENU shown in FIG. 6.
Figure 9:
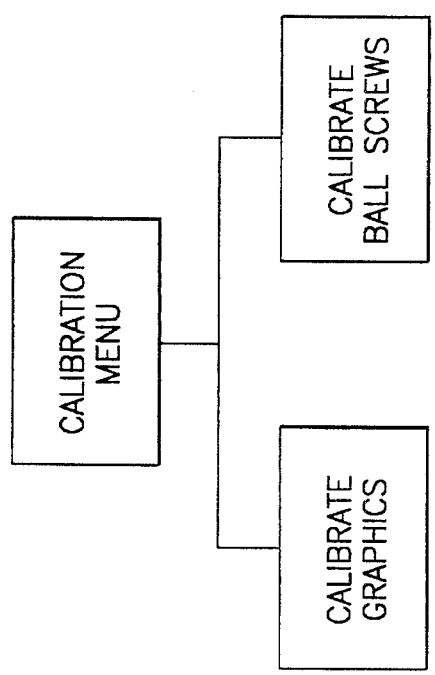
FIG. 9 is a block diagram of the CALIBRATION MENU shown in FIG. 6.
Figure 10:
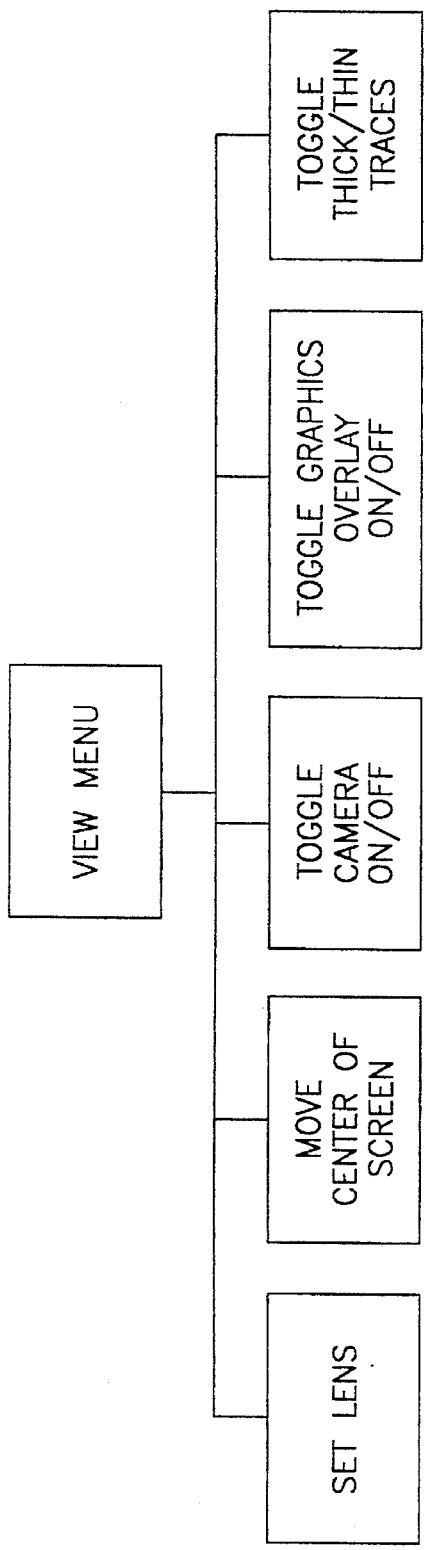
FIG. 10 is a block diagram of the VIEW MENU shown in FIG. 6.
Figure 11:
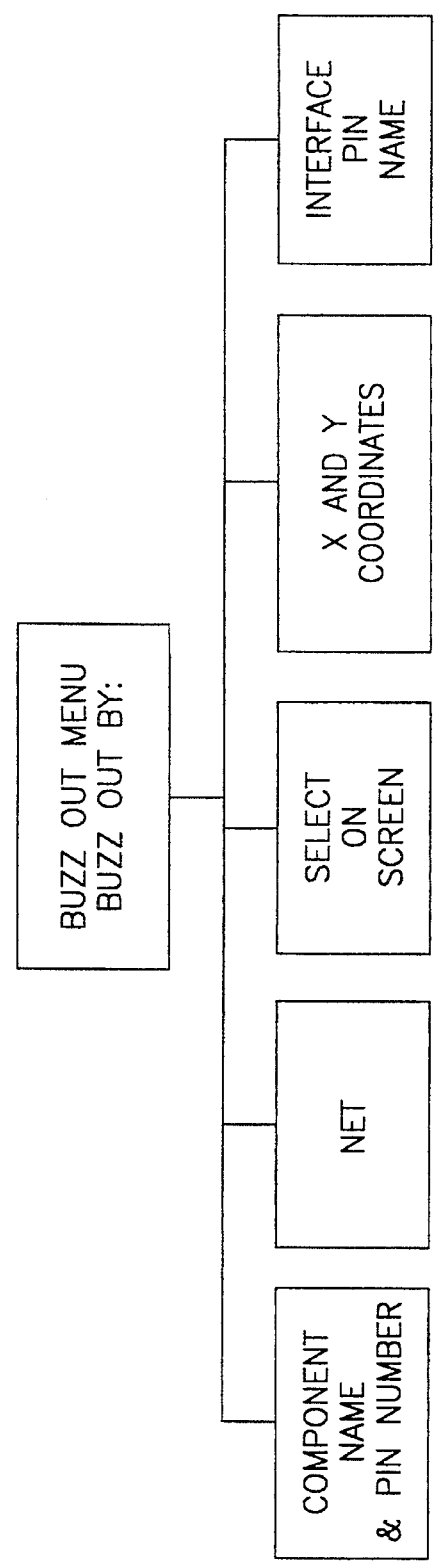
FIG. 11 is a block diagram of the BUZZ OUT MENU shown in FIG. 6.

FIG. 6 is a block diagram of the MAIN MENU and submenus of the RAID software/program that can be retrieved therefrom and that appears on the screen 42 of the monitor 44 when the computer 32 is turned on. The MAIN MENU screen is shown in FIG. 12.

FIGS. 7, 8, 9, 10 and 11 are block diagrams of the submenus entitled: SET UP MENU, CALIBRATE MENU, CALIBRATE LENS MENU, CALIBRATE BALL SCREW MENU, VIEW MENU, the menu screens for which are shown in FIGS. 13, 14, 15, 16 and 17.

Figure 12:
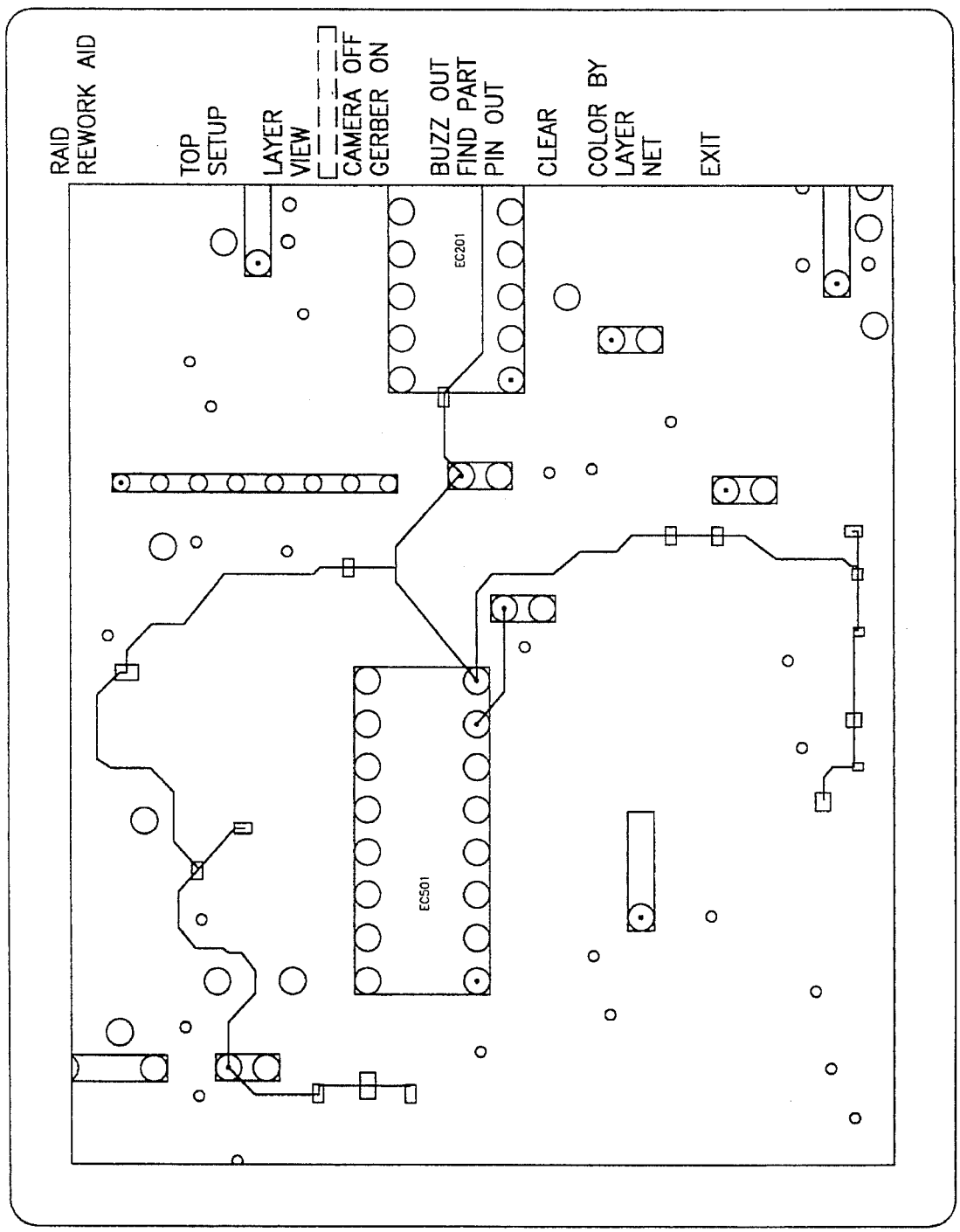
FIG. 12 is a view of the MAIN MENU as it appears on the visual display of the circuit board repair and rework apparatus and shows a photo plot of the circuit board configuration stored in memory of the computer of the apparatus and commonly referred to as "GERBER" Data which is identical to the circuit board layout of the circuit board being repaired or reworked.

FIG. 12 is a front elevational view of the visual display or screen 42 of the monitor 44 with the MAIN MENU displayed thereon. The black rectangle 140 indicates a cursor 140 that is operated by the mouse 28 for effecting different functions. The MAIN MENU utilities are as follows:

1. Top/Bottom. An operator places the cursor 140 here and presses the mouse 28 or the ENTER key on the keyboard 30 to toggle between the top and bottom of the board.

2. Setup. An operator places the cursor 140 here and presses the mouse 28 or the ENTER key on the keyboard 30 to change to Setup menu.

3. Layer. An operator places the cursor 140 here and presses the mouse 28 or the ENTER key on the keyboard 30 to edit layer display and colors.

4. View. An operator places the cursor 140 here and presses the mouse 28 or the ENTER key on the keyboard 30 to change to View Menu.

5. Camera On/Off. An operator places the cursor 140 here and presses the mouse 28 or the ENTER key on the keyboard 30 to turn the camera on and off.

6. GERBER ON/OFF. An operator places the cursor 140 here and presses the mouse 28 or the ENTER key on the keyboard 30 to turn the Gerber data on and off.

7. Buzz out. An operator places the cursor 140 here and presses the mouse 28 or the ENTER key on the keyboard 30 to display one or more signals path throughout the board.

8. Find part. An operator places the cursor 140 here and presses the mouse 28 or the ENTER key on the keyboard 30 to move the camera over the selected parts and then draws the Gerber data scaled to the lens magnification over the "live picture".

9. Pin out. An operator places the cursor 140 here and presses the mouse 28 or the ENTER key on the keyboard 30 to print the pin names on the screen of a selected part.

10. Clear. An operator places the cursor 140 here and presses the mouse 28 or the ENTER key on the keyboard 30 to remove any signal data from the display screen.

11. Color by layer/net. An operator places the cursor 140 here and presses the mouse 28 or the ENTER key on the keyboard 30 to toggle between displaying a signal color method from coloring each signal individually or each signal colored by PC Board layer number.

12. Exit. An operator places the cursor 140 here and presses the mouse 28 or the ENTER key on the keyboard 30 to exit the program.

Figure 13:
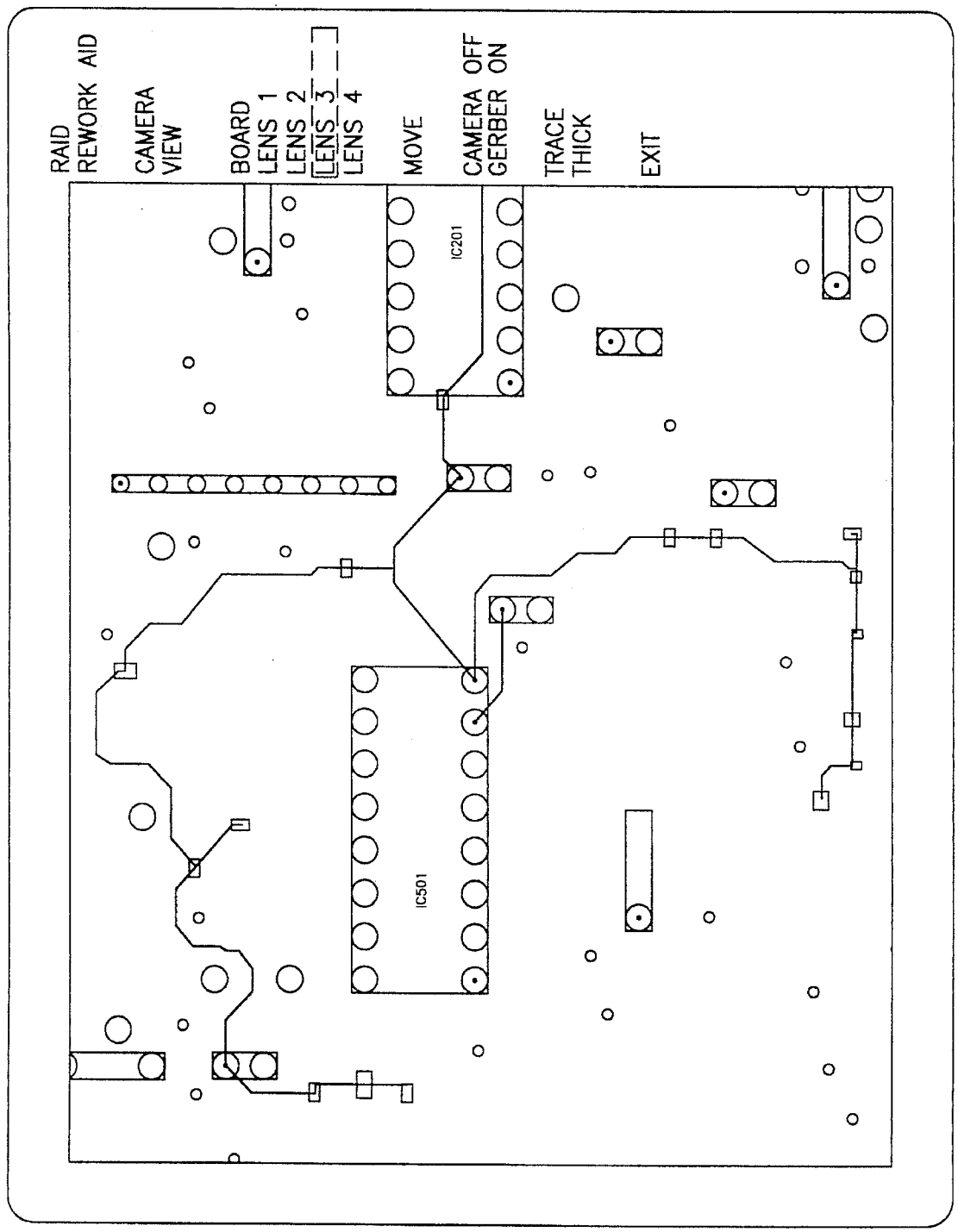
FIG. 13 is a view of the screen of the monitor or visual display of the apparatus of the present invention showing the SETUP MENU and a photo plot of "GERBER" Data.

FIG. 13 is a front elevational view of the visual display or screen 42 of the monitor 44 with the SETUP MENU displayed thereon. The black rectangle 140 indicates a cursor 140 that is operated by the mouse 28 for effecting different functions. The SETUP MENU utilities are as follows:

1. Top/Bottom. An operator places the cursor 140 here and presses the mouse 28 or the ENTER key on the keyboard 30 to toggle between the top and bottom of the board and proceed with the following setup steps.

2. Set lens. An operator places the cursor 140 here and presses the mouse 28 or the ENTER key on the keyboard 30 to enter the lens number which is under the camera. This is used only once at the beginning of each session.

3. Lens 1–4. An operator places the cursor 140 here and presses the mouse 28 or the ENTER key on the keyboard 30 to rotate the lens turret to the selected lens. Scale the Gerber the same magnification as the selected lens.

4. Set GERBER. An operator places the cursor 140 here and presses the mouse 28 or the ENTER key on the keyboard 30 to select a point from the Gerber graphic display to put in the center of the screen.

5. Set Camera. An operator places the cursor 140 here and presses the mouse 28 or the ENTER key on the keyboard 30 to select a point for the "live picture" to put in the center of the screen. This point must be the same location as the selected Gerber point.

6. Record. An operator places the cursor 140 here and presses the mouse 28 or the ENTER key on the keyboard 30 once the camera view and the Gerber graphics align exactly and this function will record the data for all movement and graphic calculations.

7. Calibrate. An operator places the cursor 140 here and presses the mouse 28 or the ENTER key on the keyboard 30 to change to calibrate menu.

8. Exit. An operator places the cursor 140 here and presses the mouse 28 or the ENTER key on the keyboard 30 to exit to main menu.

Figure 14:
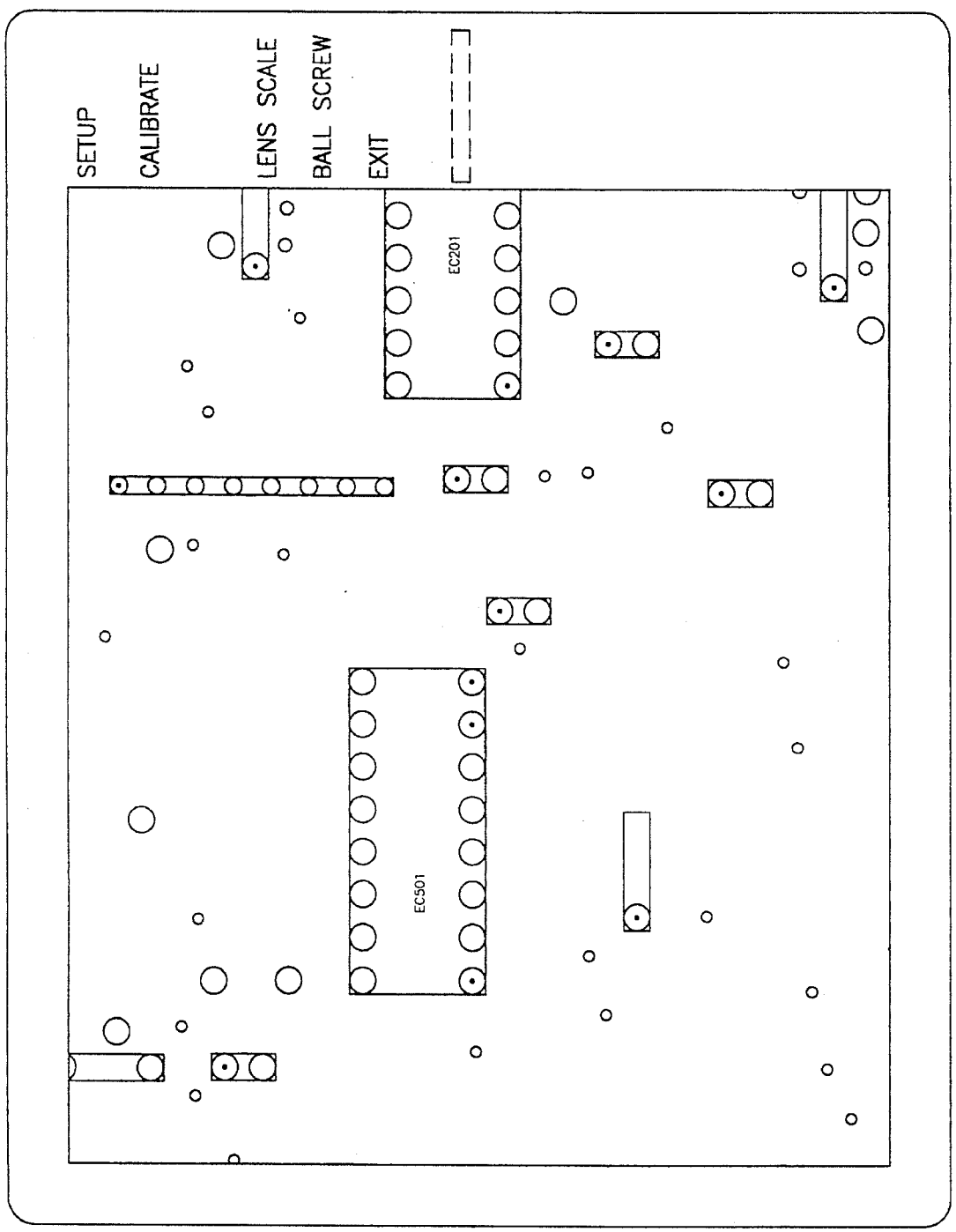
FIG. 14 is a view of the screen of the visual display/monitor showing the main CALIBRATE MENU and a photo plot of "GERBER" Data.

FIG. 14 is a front elevational view of the visual display or screen 42 of the monitor 44 with the MAIN CALIBRATE MENU displayed thereon. The black rectangle 140 indicates a cursor 140 that is operated by the mouse 28 for effecting different functions. The MAIN CALIBRATE MENU utilities are as follows:

1. Lens Scale. An operator places the cursor 140 here and presses the mouse 28 or the ENTER key on the keyboard 30 to change the calibrate lens menu.

2. Ball Screw. An operator places the cursor 140 here and presses the mouse 28 or the ENTER key on the keyboard 30 to change to calibrate ball screw menu.

3. Exit. An operator places the cursor 140 here and presses the mouse 28 or the ENTER key on the keyboard 30 to exit to setup menu.

Figure 15:
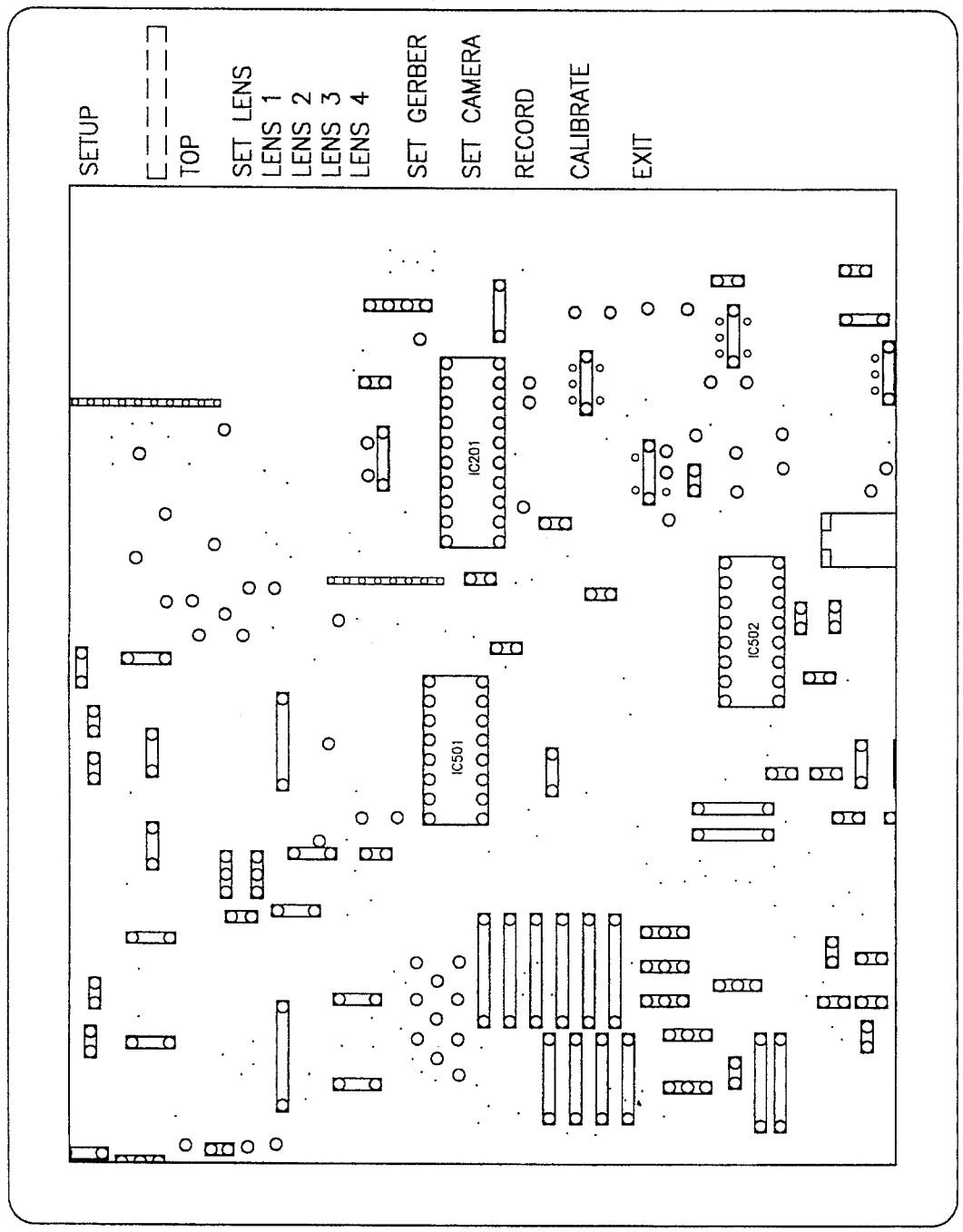
FIG. 15 is a view of the screen of the visual display/monitor showing the main CALIBRATE LENS MENU and a photo plot of "GERBER" Data.

FIG. 15 is a front elevational view of the visual display or screen 42 of the monitor 44 with the CALIBRATE LENS MENU displayed thereon. The black rectangle 140 indicates a cursor 140 that is operated by the mouse 28 for effecting different functions. The CALIBRATE LENS MENU utilities are as follows:

1. Lens 1–4. An operator places the cursor 140 here and presses the mouse 28 or the ENTER key on the keyboard 30 to rotate the lens turret to the selected lens. Scale the Gerber graphic display to overlay at the same magnification as the selected lens.

2. +/−. An operator places the cursor 140 here and presses the mouse 28 or the ENTER key on the keyboard 30 to increase or decrease the scale at which the Gerber graphics are calculated in relation to the "live picture" at the selected lens magnification.

3. Exit. An operator places the cursor 140 here and presses the mouse 28 or the ENTER key on the keyboard 30 to exit to main calibrate menu.

Figure 16:
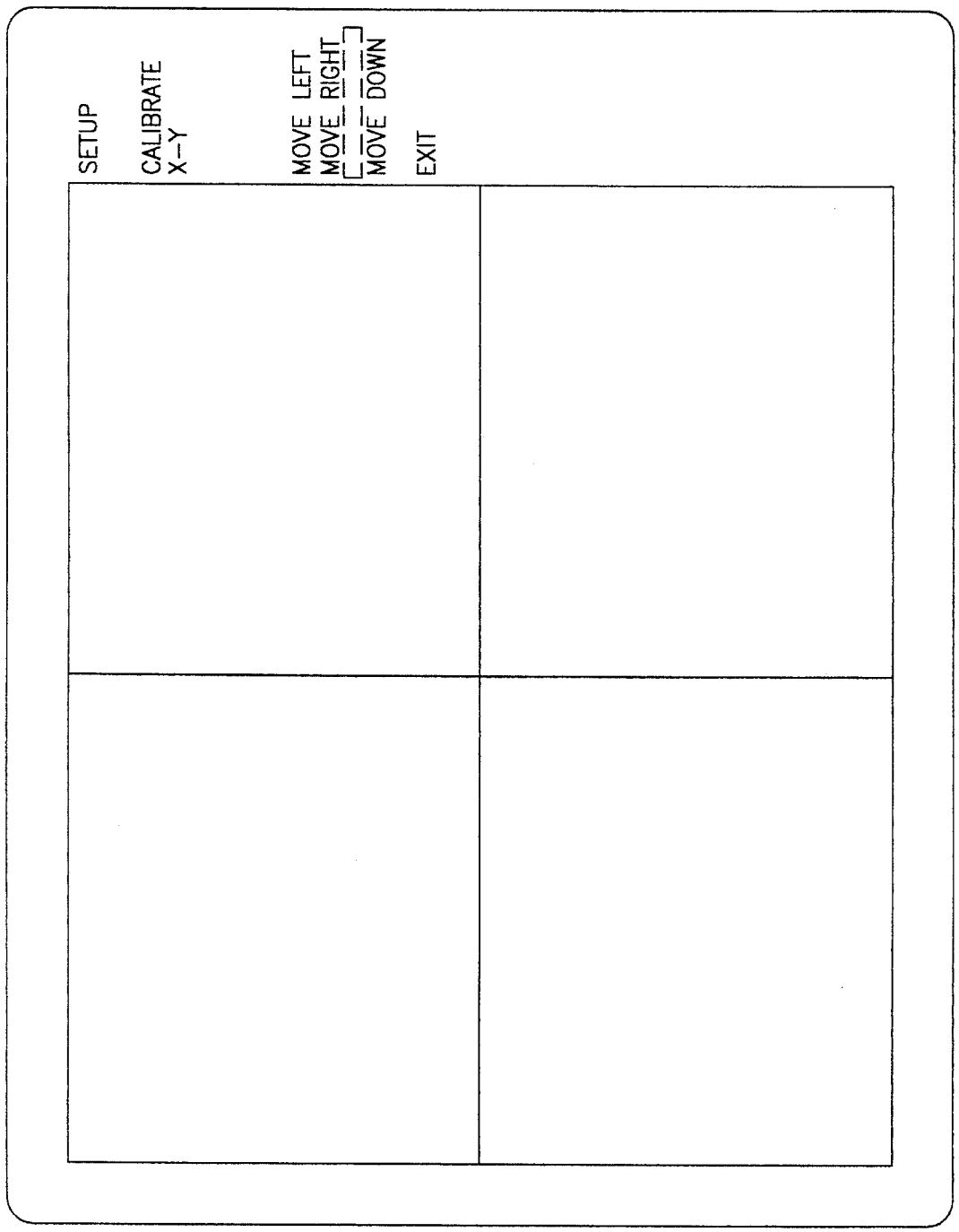
FIG. 16 is a view of the screen of the visual display/monitor showing the main CALIBRATE BALL SCREW MENU.

FIG. 16 is a front elevational view of the visual display or screen 42 of the monitor 44 with the CALIBRATE BALL SCREW MENU displayed thereon. The black rectangle 140 indicates a cursor 140 that is operated by the mouse 28 for effecting different functions. The CALIBRATE BALL SCREW MENU utilities are as follows:

1. Move left, right, up, down. An operator places the cursor 140 here and presses the mouse 28 or the ENTER key on the keyboard 30 to place an accurate scale under the camera. Select the direction to move the camera and enter the distance the camera is to move. Jog the camera so the cross hairs line up with the scale. All motion calculation will compensate for any changes entered.

2. Exit. An operator places the cursor 140 here and presses the mouse 28 or the ENTER key on the keyboard 30 to exit to the main calibrate menu.

Figure 17:
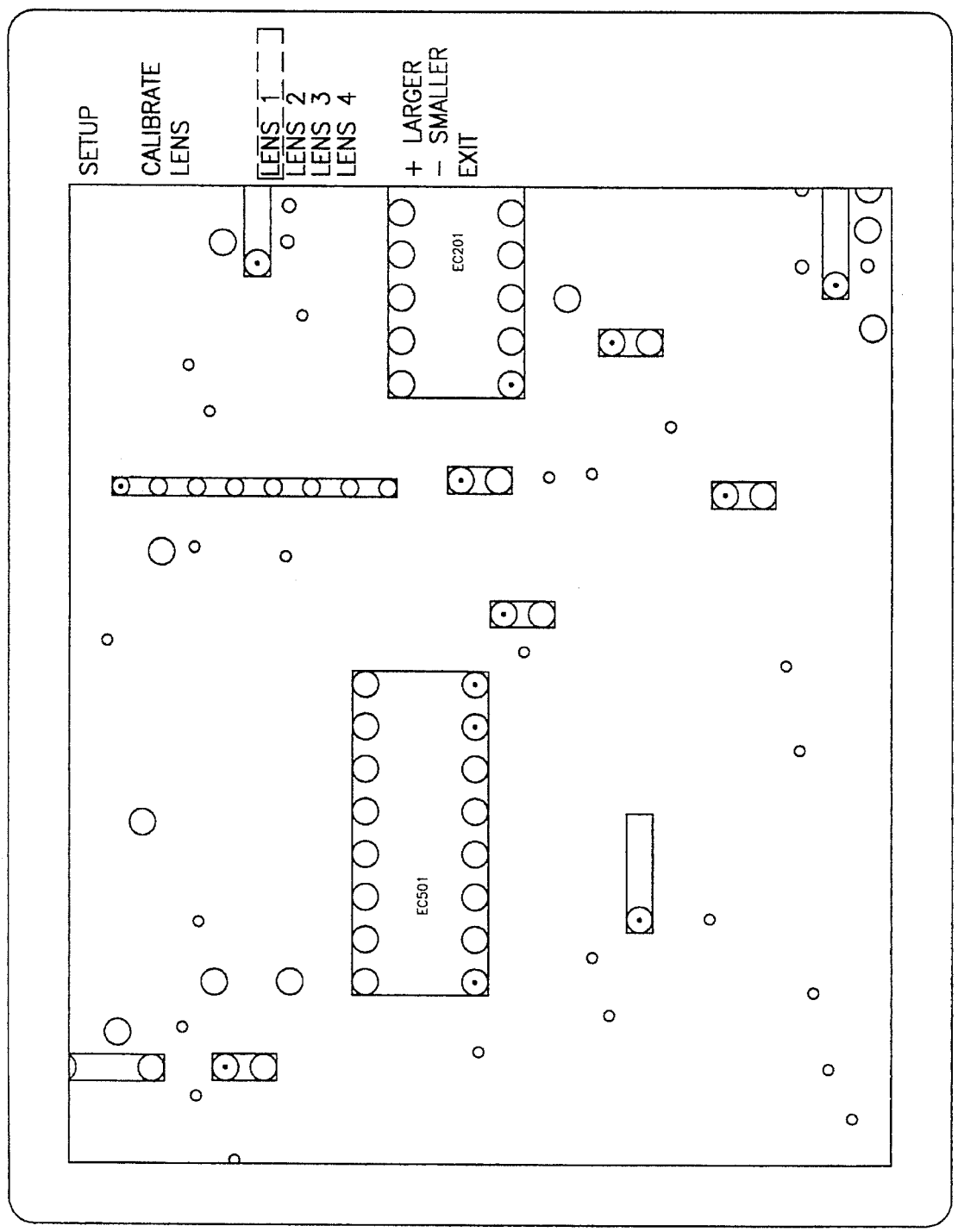
FIG. 17 is a view of the screen of the visual display/monitor showing the VIEW MENU.

FIG. 17 is a front elevational view of the visual display or screen 42 of the monitor 44 with the VIEW MENU displayed thereon. The black rectangle 140 indicates a cursor 140 that is operated by the mouse 28 for effecting different functions. The VIEW MENU utilities are as follows:

1. Lens 1–4. An operator places the cursor 140 here and presses the mouse 28 or the ENTER key on the keyboard 30 to rotate the lens turret to the selected lens. Scale the Gerber graphic display to overlay at the same magnification as the selected lens.

2. Move. An operator places the cursor 140 here and presses the mouse 28 or the ENTER key on the keyboard 30 to select a point on the screen with the mouse. The camera will move so the selected point will be in the center of the screen. The Gerber graphic display will overlay the "live picture".

3. Camera On/Off. An operator places the cursor 140 here and presses the mouse 28 or the ENTER key on the keyboard 30 to turn the camera on and off.

4. GERBER ON/OFF. An operator places the cursor 140 here and presses the mouse 28 or the ENTER key on the keyboard 30 to turn the Gerber data on and off.

5. Trace thick/Thin. An operator places the cursor 140 here and presses the mouse 28 or the ENTER key on the keyboard 30 to toggle between stick figure or full width when drawing traces.

6. Exit. An operator places the cursor 140 here and presses the mouse 28 or the ENTER key on the keyboard 30 to exit to main menu.

Figure 18:
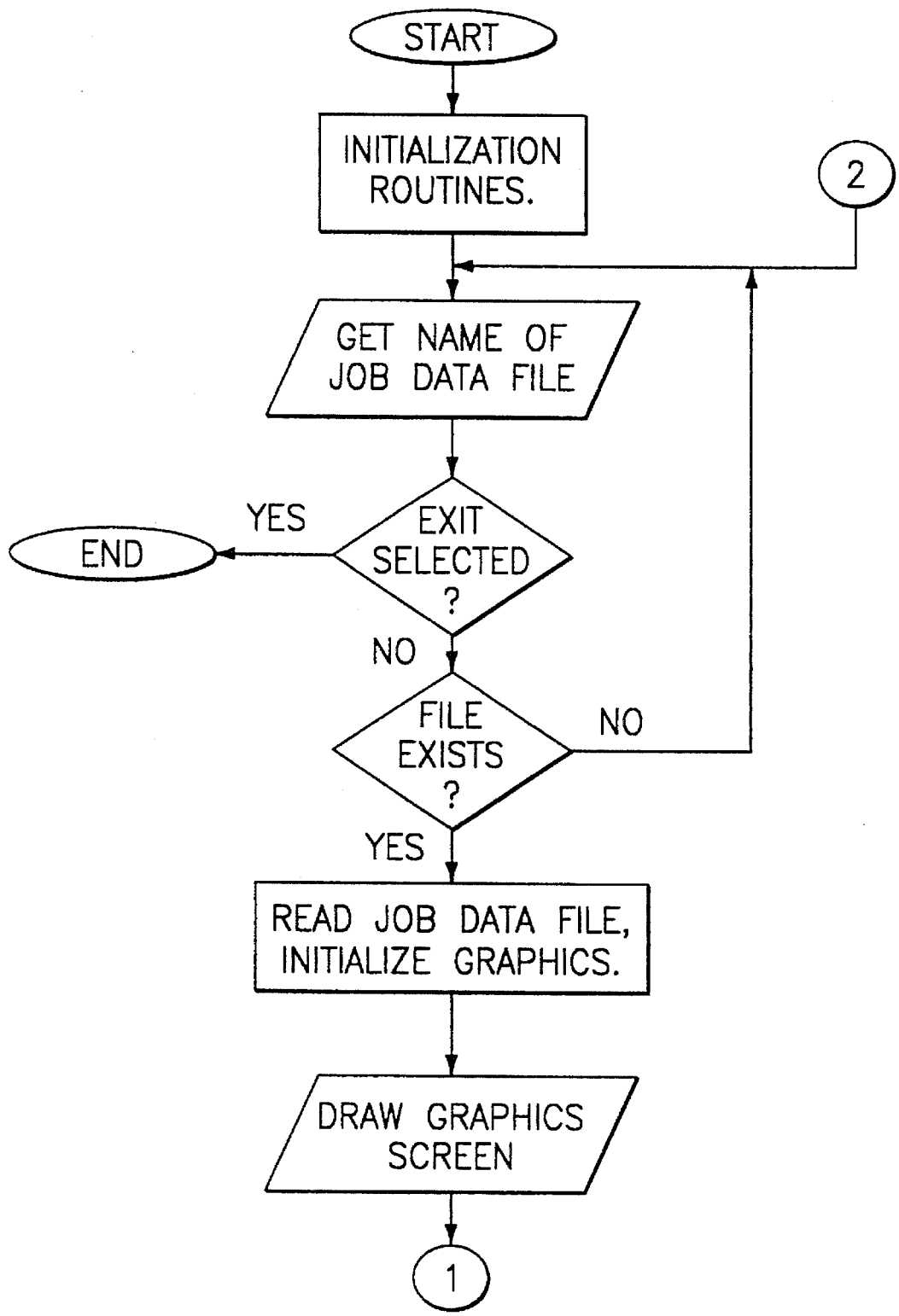
Figure 19:
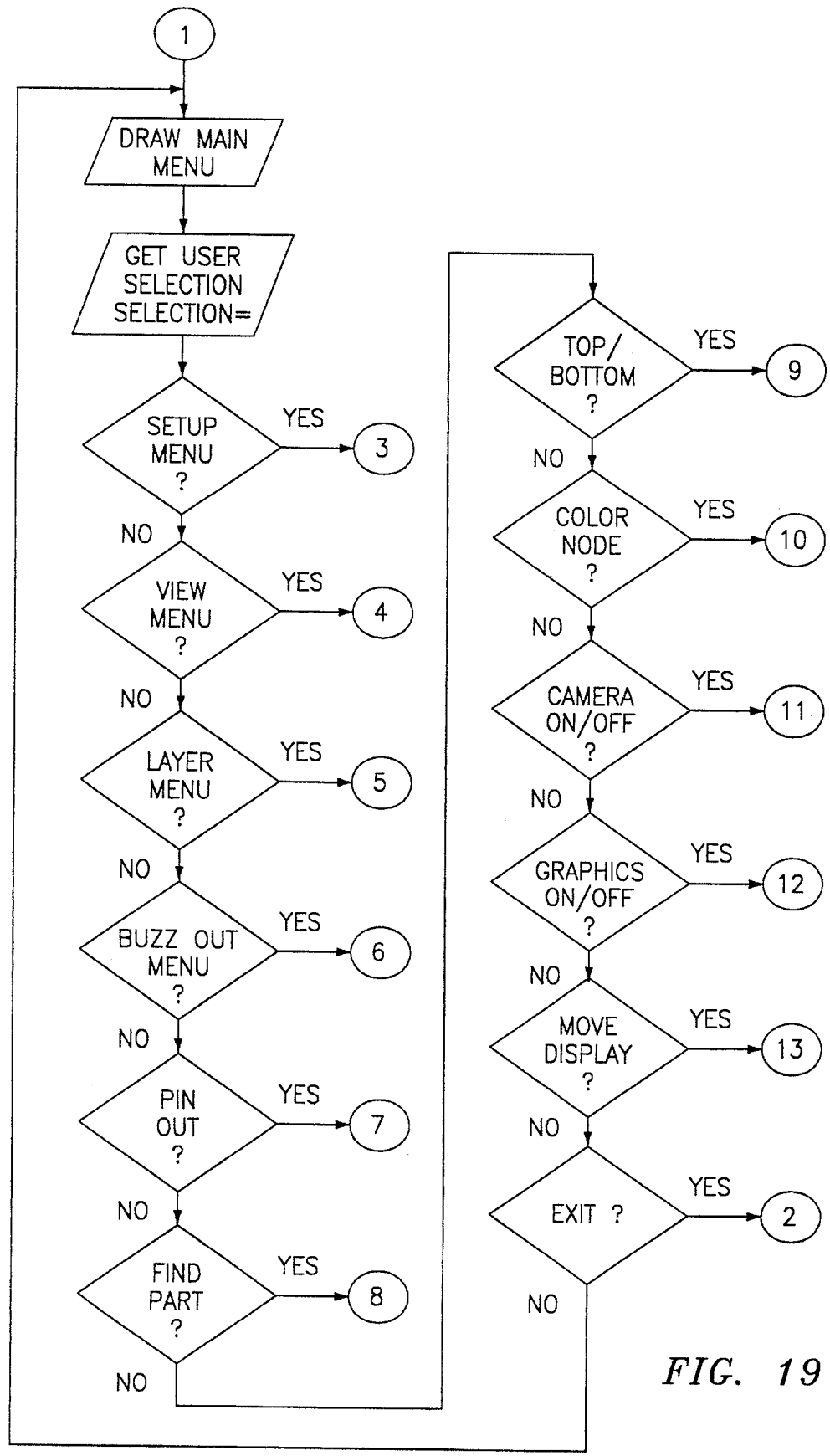

FIGS. 18 and 19 are flow charts of the initial steps carried out by the RAID software/program when the computer 32 is turned on and the user pulls up the main menu on the screen 42 and with the mouse 28 and keyboard 30 proceeds to set up the computer 32 and the apparatus 10 for overlaying a digitized plot or layout of the circuit board 18 on the screen 42 over the digitized camera image also displayed on the screen 42 of the monitor 44.

Figure 20:
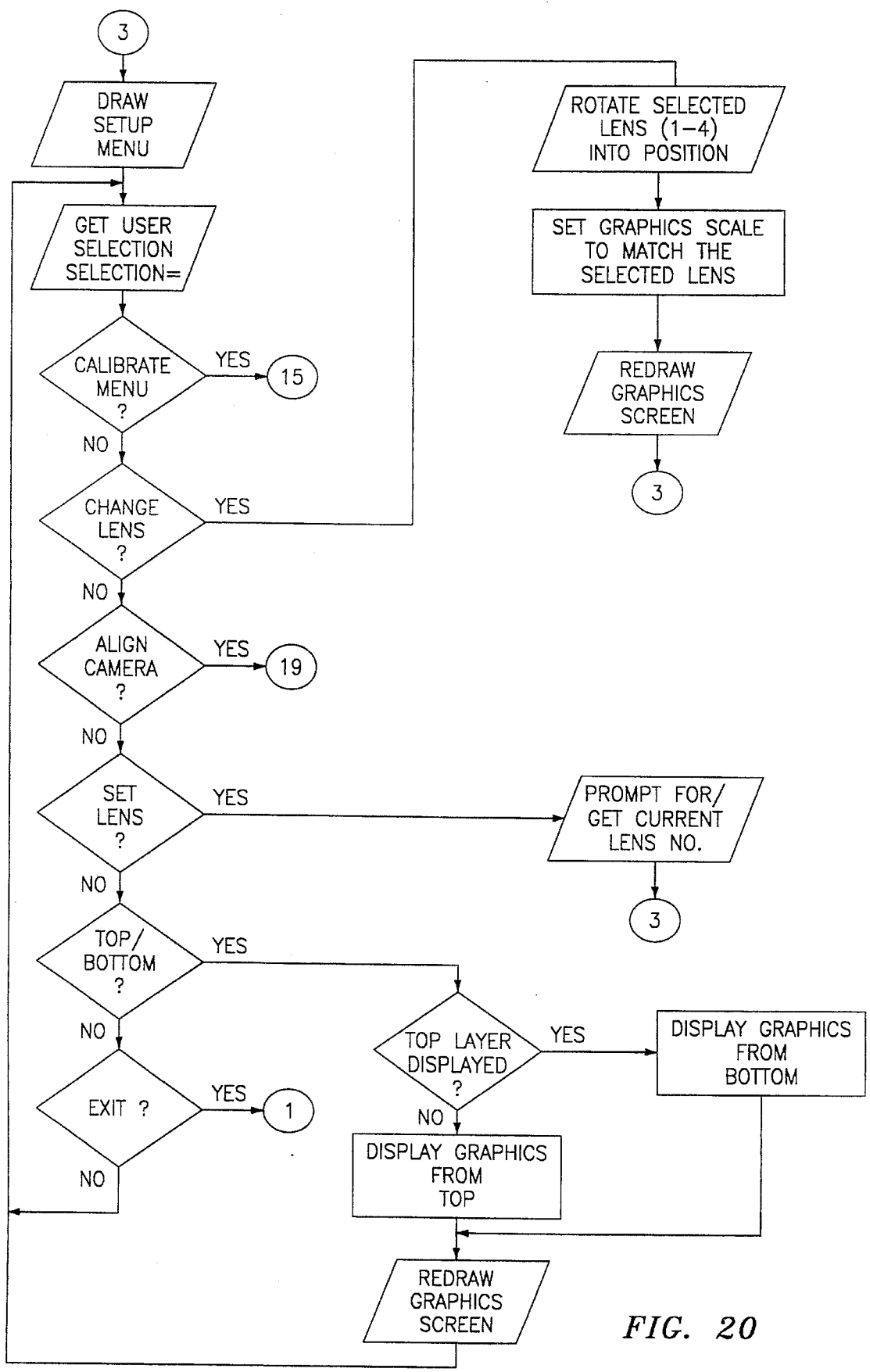
Figure 21A:
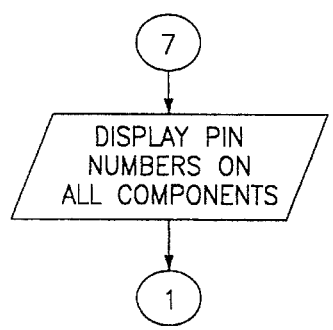
Figure 21C:
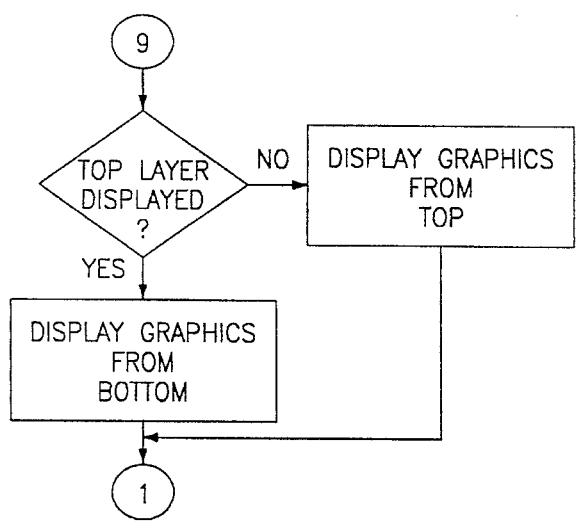
Figure 21B:
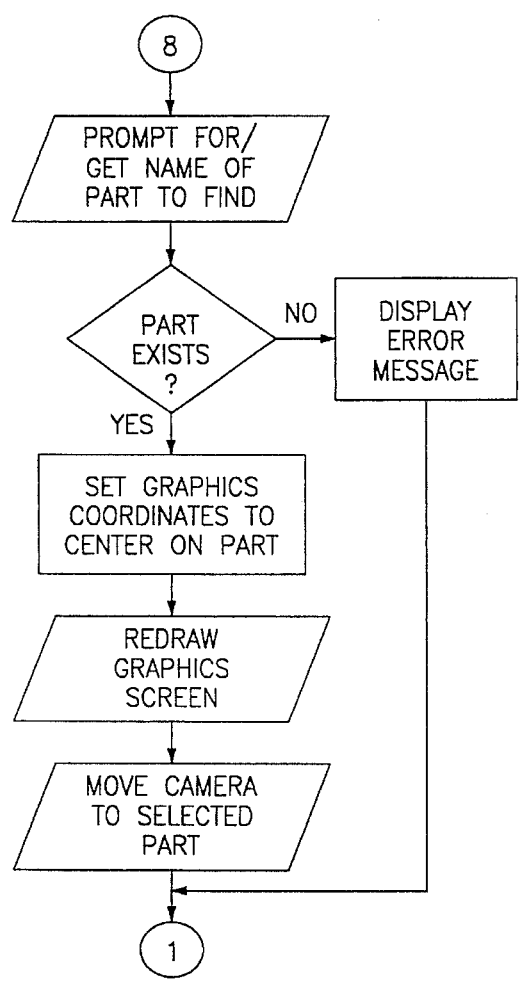
Figure 21D:
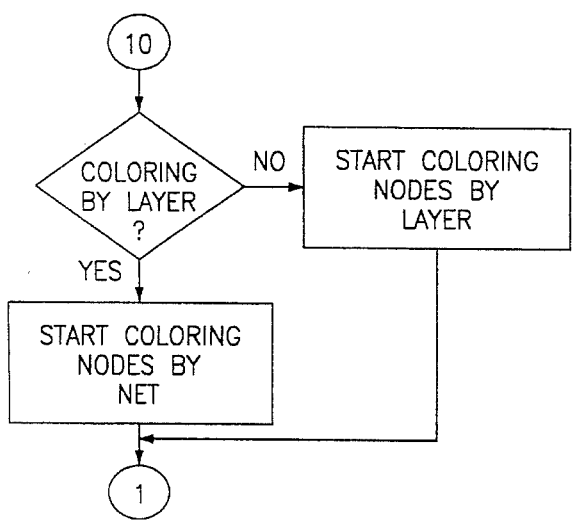
Figure 21E:
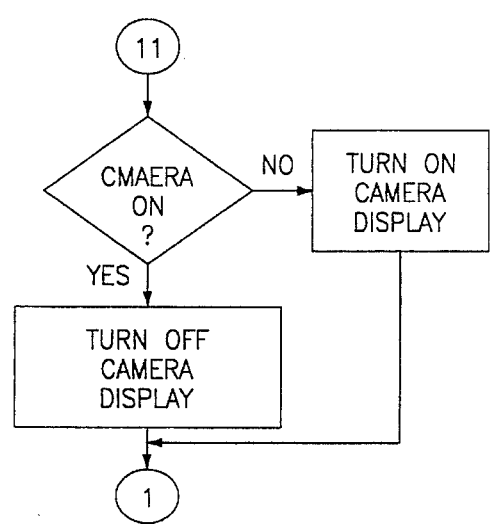

Then in FIG. 20 is a flow chart of the steps carried out in the draw setup submenu.

An important feature of applicant's RAID software/program is that it can take the "GERBER" data and invert it just as if one flipped over on the screen 42 the circuit board image plotted on the screen to show the bottom side of the circuit board as derived from the "GERBER" data. This is shown at the determination or decision step "TOP/BOTTOM" and succeeding steps where the operator can turn over the circuit board in the fixture 16 and with the mouse 28 and/or the keyboard 30 can turn the plot from the "GERBER" data over on the screen such that it will align with the digitized and displayed image of the circuit board 18 positioned beneath the camera 48.

FIGS. 21A–21G on the 17th and 19th sheets of the drawings are flow charts of steps of the subroutines that are carried out from the decision steps shown in FIG. 19 for retrieving specific information from the "GERBER" data and the RAID program, for operating the camera, for turning over the graphics and for moving the display.

Figure 22:
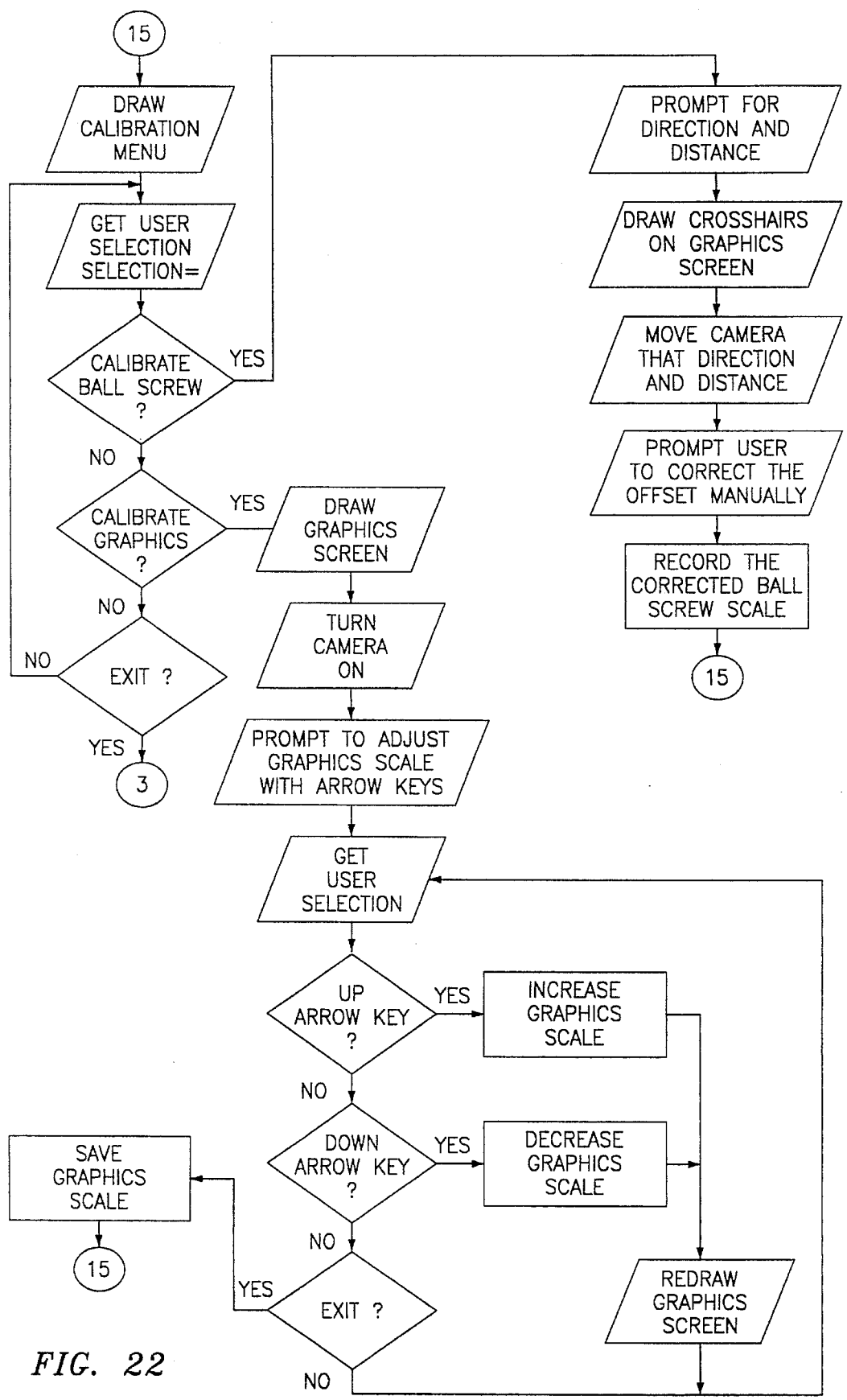
Figure 21F:
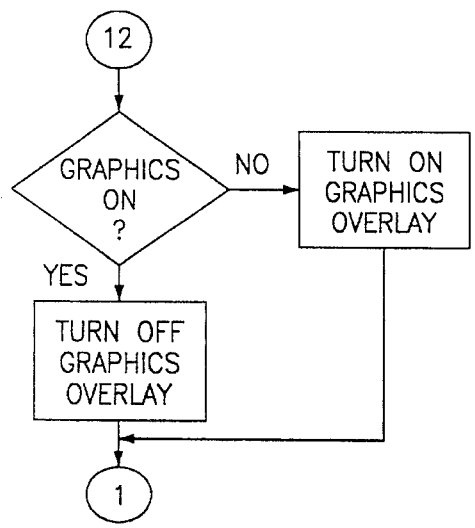
Figure 21G:
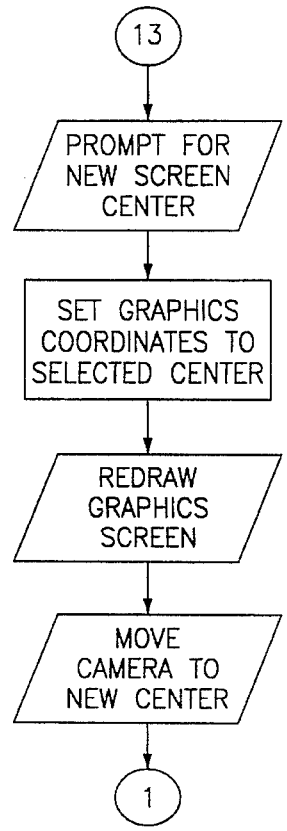

FIG. 22 is flow charts of the steps carried out by the RAID program from the calibration decision step shown in FIG. 20.

Figure 23:
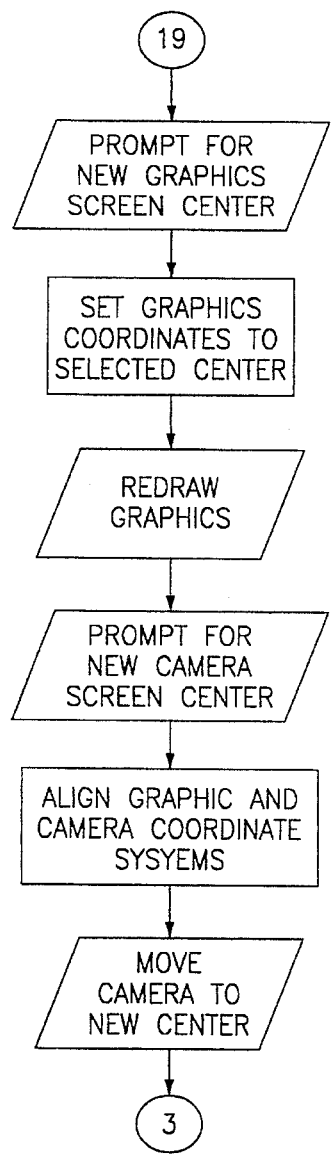

FIG. 23 is flow charts of the steps carried out by the RAID program from the aligned camera decision step shown in FIG. 20.

Figure 24:
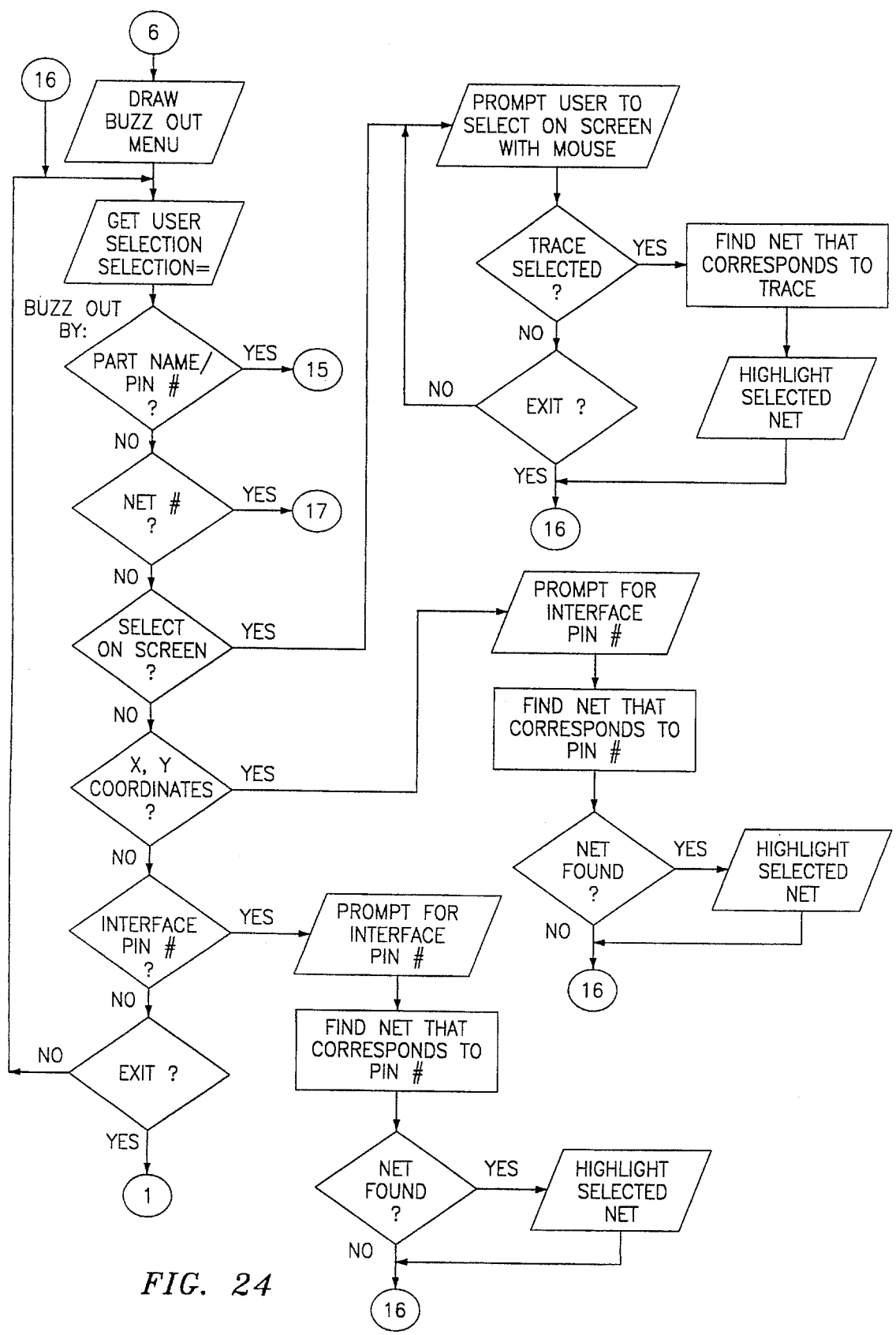

FIG. 24 is flow charts of the steps carried out from the buzz out menu decision step shown in FIG. 19 and to a loop back to an exit decision step.

FIG. 25 is flow charts of the steps carried out from the calibrate menu decision step shown in FIG. 20.

FIG. 26 is a flow chart of the steps carried out by the RAID program from the net # decision step shown in FIG. 24.

Figure 27:
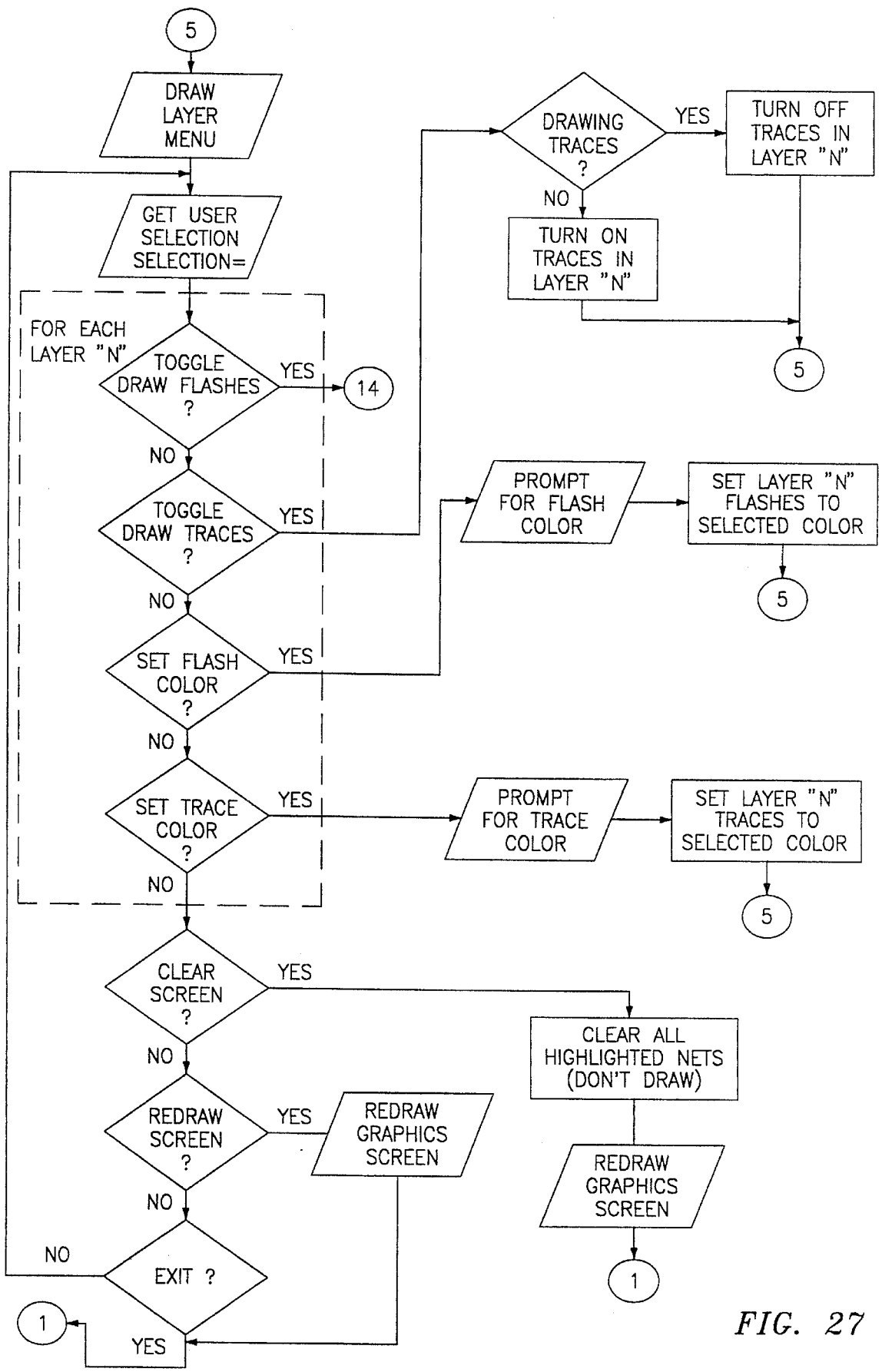

FIG. 27 is a flow chart of the steps carried out from the layer menu decision step shown in FIG. 19.

FIG. 28 is a flow chart of the steps carried out from the toggle draw flashes decision step shown in FIG. 27.

Figure 29:
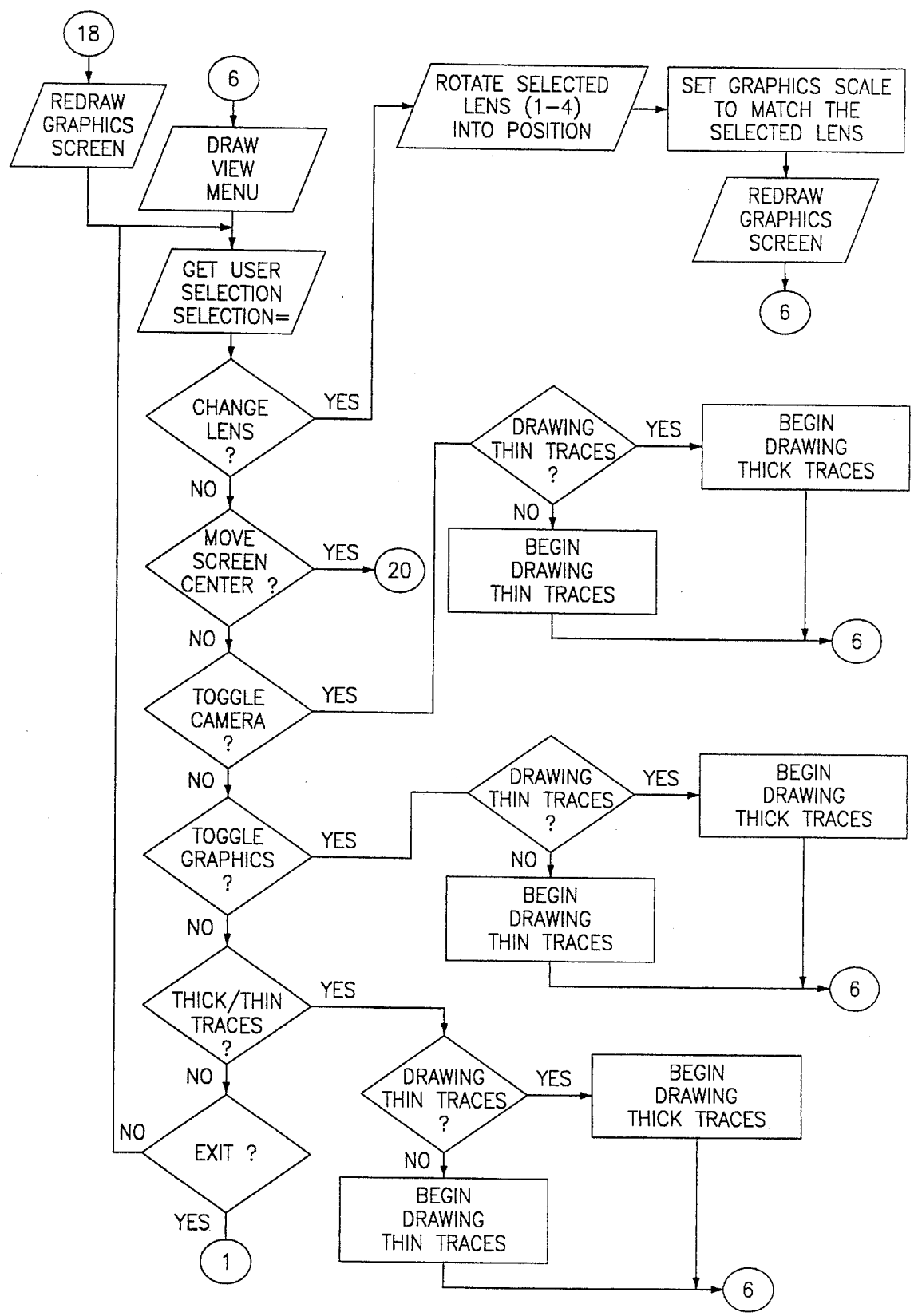

FIG. 29 is a flow chart of the steps carried out from the redraw graphic screen step shown in FIG. 22.

FIG. 30 is a flow chart of the steps carried out from the move screen center decision step shown in FIG. 29.

The apparatus 10 and the RAID software/program therein provide a circuit board repair and rework system which enables an operator simply to place a circuit board 18 in the fixture 16 and then with the use of the mouse 28 and/or keyboard 30 to zero in a digitized representation of the camera image of the circuit board over a plot of the circuit board generated from "GERBER" data of the circuit board stored in the computer 32.

Then the operator can enter an error message into the computer which will then collate that error message with the location of circuit board components or elements that may be defective or shorted together such as to give rise to that error message and automatically position the camera over that portion of the circuit board.

Next, the operator can adjust the focus of the camera on the circuit board and increase the magnification of the digitized representation of the camera image and simultaneously adjust the scaling of the plot of the "GERBER" data to the chosen magnification to see, on an enlarged scale, the area where there may be a short circuit or defective circuit component.

The operator then can effect quickly repairs or reworking of the circuit board in that location.

To this end, the operator can also turn over the circuit board and can obtain an image of the reverse side of the circuit board and automatically generate from the "GERBER" data a plot of the reverse side of the circuit board and automatically move the camera to the location on the reverse side of the circuit board where a defective component or short circuit may exist on the circuit board. In other words, the camera is moved to a mirror image position of the location on the other side of the circuit board under investigation.

From the foregoing description, it will be apparent that the apparatus 10 and the RAID software/program therein and a method of using the apparatus 10 provide a number of advantages, some of which have been described above and others of which are inherent in the invention. In particular, the apparatus 10 and method for using same enable an operator to quickly zero in on a location on a circuit board to be investigated relative to an error message generated from a test of the circuit board and then enable the operator quickly to magnify and adjust the scale of overlying plots of the circuit board, one generated from a camera and one generated from "GERBER" data. Further, the operator can easily switch from one side of a circuit board to the other side of a circuit board and quickly zero in on the same location on the circuit board from either side thereof for effecting repairs to or reworking of the circuit board.

Additionally, the operator can compensate for non-linearities or non-parallel relationships between the camera and the circuit board along the X axis, the Y axis and the Z axis.

Further, from the foregoing description it will be apparent that modifications can be made to the apparatus and method of the present invention without departing from the teachings of the invention. Accordingly, the scope of the invention is only to be limited as necessitated by the accompanying claims.

I claim:

1. A method for repairing or reworking a circuit board utilizing a camera including a lens system and a computer including a CPU and memory means having "GERBER" design data related to a plot or layout of a circuit board under investigation stored therein, the method comprising the steps of:

positioning a circuit board in a predetermined location beneath the camera;

positioning the camera relative to said circuit board to a desired position over the circuit board;

focusing the camera on the circuit board;

digitizing the camera image and supplying the digitized representation of the camera image to the computer;

overlaying said digitized image on a circuit board plot generated by the "GERBER" design data for said desired position;

establishing on a visual display coupled to the computer an overlay in registry between the plot of the digitized camera image of the circuit board and the plot of the circuit board generated from the "GERBER" design data;

inputting an error message into the computer;

locating from the "GERBER" design data of a plot of the circuit board the location where the defect in or short between circuit elements on the circuit board would cause the error message to be generated; and automatically positioning the camera at the location over those circuit board element components of the overlay of the plot of the circuit board.

2. The method of claim 1 further including the steps of changing the magnification of the camera image and simultaneously changing the scaling plot of the "GERBER" data to correspond with the magnification of the camera.

3. The method of claim 2 including the step of inputting "GERBER" data for a plurality of layers of circuit traces and linking the "GERBER" data to drill and via data.

4. The method of claim 3 including the steps of:

beginning with a location on the circuit board centered with the camera, turning the circuit board over;

simultaneously generating from the "GERBER" data an image of the reverse side of the circuit board; and at the same time, moving the camera to center or zero in on the mirror image of the same location where the camera was centered on the first side of the circuit board and now being viewed from the reverse side of the circuit board.

5. A circuit board repair and rework apparatus comprising:

a camera;

a circuit board positioned in a predetermined location beneath said camera;

a computer including a CPU and a memory;

a means coupled between said camera and said computer to digitize the camera image and supply the digitized representation of the camera image to said computer;

a visual display coupled to said computer;

said memory storing both "GERBER" data related to a plot or layout of the circuit board positioned beneath said camera and drill or via data;

a carriage coupled to said computer to position said camera at a desired position over the circuit board, said carriage providing said camera with movement parallel to said circuit board;

a rotatable lens mounting plate or table carrying at least two lenses that can be rotated into alignment with the camera, each said lens including a cylindrical housing having a reduced diameter extension thereof, said lens mounting plate or table having a circular cutout on the bottom side thereof for each lens housing and a throughbore which is coaxial with the cylindrical cutout for each lens, said extension extending through said throughbore and being fixed in a bore of one of said mounting blocks, the diameter of said circular cutout being greater than the diameter of a portion of a lens cylindrical housing received therein, said coaxial throughbore in said mounting plate having a diameter greater than the diameter of the lens housing extension received therethrough, each mounting block having spaced apart threaded holes therein and said mounting plate in the area opposite each mounting block having holes therein which are aligned with the threaded holes in the mounting block, but which have a larger diameter than said holes in said mounting block whereby a plurality of threaded fasteners received through said holes in said mounting plate can be shifted laterally in a small amount in the X axis direction or the Y axis direction;

a means for both focusing and for changing the magnification of said camera on the circuit board;

an input to said computer for controlling the position of said camera and for causing an overlay on the visual display between a plot of the digitized camera image of the circuit board and the plot of the circuit board obtained from the "GERBER" data; and said plurality of threaded fasteners being effective to shift the center of each lens mounted on said lens mounting plate or table in at least one of the X axis direction and the Y axis direction perpendicular to the Z axis to compensate for any skew in the Z axis between said camera and the circuit board or to compensate for any tilt of the circuit board relative to the Z axis.

* * * * *